(12) United States Patent
Izumi et al.

(10) Patent No.: US 9,789,637 B2
(45) Date of Patent: Oct. 17, 2017

(54) ELECTRONIC DEVICE AND METHOD FOR MANUFACTURING THE SAME

(71) Applicant: DENSO CORPORATION, Kariya, Aichi-pref. (JP)

(72) Inventors: Ryosuke Izumi, Nagoya (JP); Takashige Saito, Ama (JP); Hiroyuki Okuhira, Kariya (JP); Yuuichi Ikuno, Obu (JP); Kouji Yamamoto, Nakata-gun (JP)

(73) Assignee: DENSO CORPORATION, Kariya (JP)

( * ) Notice: Subject to any disclaimer, the term of this patent is extended or adjusted under 35 U.S.C. 154(b) by 154 days.

(21) Appl. No.: 14/414,831

(22) PCT Filed: Jul. 10, 2013

(86) PCT No.: PCT/JP2013/004257
§ 371 (c)(1),
(2) Date: Jan. 14, 2015

(87) PCT Pub. No.: WO2014/013697
PCT Pub. Date: Jan. 23, 2014

(65) Prior Publication Data
US 2015/0158221 A1    Jun. 11, 2015

(30) Foreign Application Priority Data

Jul. 16, 2012  (JP) .................................. 2012-158220
Dec. 4, 2012  (JP) .................................. 2012-265313
Feb. 21, 2013  (JP) .................................. 2013-032194

(51) Int. Cl.
*B29C 45/16*   (2006.01)
*H05K 5/00*   (2006.01)
(Continued)

(52) U.S. Cl.
CPC .............. *B29C 45/16* (2013.01); *B29C 43/18* (2013.01); *B29C 45/1657* (2013.01);
(Continued)

(58) Field of Classification Search
CPC ..... B29C 45/16; B29C 43/18; B29C 45/1657; B29C 45/1671; G01L 19/141; H01L 21/565; H05K 5/0095; H05K 5/065
See application file for complete search history.

(56) References Cited

U.S. PATENT DOCUMENTS 5,087,514 A *  2/1992  Graefe .................. B29C 70/683
                                                     428/315.5
5,948,991 A     9/1999  Nomura et al.
(Continued)

FOREIGN PATENT DOCUMENTS

JP        04-144745 A     5/1992
JP     2002-289717 A    10/2002
(Continued)

OTHER PUBLICATIONS

Office Action dated Nov. 9, 2015 in the corresponding CN application No. 201380038197.1 (with English translation).
(Continued)

*Primary Examiner* — James Wu
*Assistant Examiner* — Michael Matey
(74) *Attorney, Agent, or Firm* — Posz Law Group, PLC

(57) ABSTRACT

An electronic device includes a first molded product integrated with an electronic component, and a second molded product secondarily molded outside of the first molded product. The first molded product includes a thermosetting resin, and a first additive contained in the thermosetting resin, and the second molded product includes a thermoplastic resin, and a second additive contained in the thermoplastic resin and having a reactive group that chemically
(Continued)

bonds with the first additive. At an interface between the first molded product and the second molded product, the first additive and the second additive are joined to each other by one or more joint actions selected from covalent bonding, ionic bonding, hydrogen bonding, intermolecular forces, dispersion force, and diffusion. As a result, the adhesion between both the molded products can be firmly secured through the molding technique such as the transfer molding method or the compression molding method.

20 Claims, 11 Drawing Sheets

(51) Int. Cl.
| | |
|---|---|
| H05K 5/06 | (2006.01) |
| B29C 43/18 | (2006.01) |
| G01L 19/14 | (2006.01) |
| H01L 21/56 | (2006.01) |
| H01L 23/31 | (2006.01) |
| B29C 45/14 | (2006.01) |
| B29C 45/02 | (2006.01) |
| B29K 101/10 | (2006.01) |
| B29K 101/12 | (2006.01) |
| B29L 31/34 | (2006.01) |

(52) U.S. Cl.
CPC ........ *B29C 45/1671* (2013.01); *G01L 19/141* (2013.01); *H01L 21/565* (2013.01); *H01L 23/3135* (2013.01); *H01L 23/3142* (2013.01); *H05K 5/0095* (2013.01); *H05K 5/065* (2013.01); *B29C 45/02* (2013.01); *B29C 45/14639* (2013.01); *B29C 2045/1664* (2013.01); *B29K 2101/10* (2013.01); *B29K 2101/12* (2013.01); *B29L 2031/3481* (2013.01); *H01L 23/3107* (2013.01); *H01L 2224/32245* (2013.01); *H01L 2224/48091* (2013.01); *H01L 2224/48247* (2013.01); *H01L 2924/181* (2013.01)

(56) References Cited

U.S. PATENT DOCUMENTS

| 6,259,157 | B1 | 7/2001 | Sakamoto et al. |
| 8,415,007 | B2* | 4/2013 | Honma ............... B32B 5/10 428/298.1 |
| 2001/0040262 | A1* | 11/2001 | Uchida .............. B81C 1/00269 257/415 |
| 2002/0037143 | A1* | 3/2002 | Kuhara ............. G02B 6/29361 385/94 |
| 2002/0063332 | A1 | 5/2002 | Yamaguchi et al. |
| 2003/0052396 | A1* | 3/2003 | Tajima .................. H01L 23/293 257/678 |
| 2004/0077771 | A1* | 4/2004 | Wadahara ............. B82Y 30/00 524/495 |
| 2005/0029906 | A1* | 2/2005 | Miyaji ..................... H03H 3/08 310/348 |
| 2009/0023253 | A1* | 1/2009 | Tajima .................. H01L 23/293 438/127 |
| 2009/0062454 | A1 | 3/2009 | Hardouin-Duparc et al. |
| 2011/0139802 | A1* | 6/2011 | Takahata ............... H01L 23/293 220/729 |
| 2013/0224508 | A1* | 8/2013 | Todesco ................ B29C 45/561 428/523 |
| 2014/0315356 | A1* | 10/2014 | Hashimoto ............. H01L 21/56 438/127 |

FOREIGN PATENT DOCUMENTS

| JP | 2002-321249 A | 11/2002 |
| JP | 2004-307628 A | 11/2004 |
| JP | 2004-335816 A | 11/2004 |
| JP | 2011-166124 A | 8/2011 |
| JP | 2011-256155 A | 12/2011 |
| JP | 2011-256291 A | 12/2011 |

OTHER PUBLICATIONS

International Search Report and Written Opinion of the International Searching Authority dated Aug. 6, 2013 for the corresponding International application No. PCT/JP2013/004257 (and English translation).

Office Action dated Sep. 22, 2014 for the corresponding JP application No. 2013-032194 (and English translation).

* cited by examiner

FIG. 11
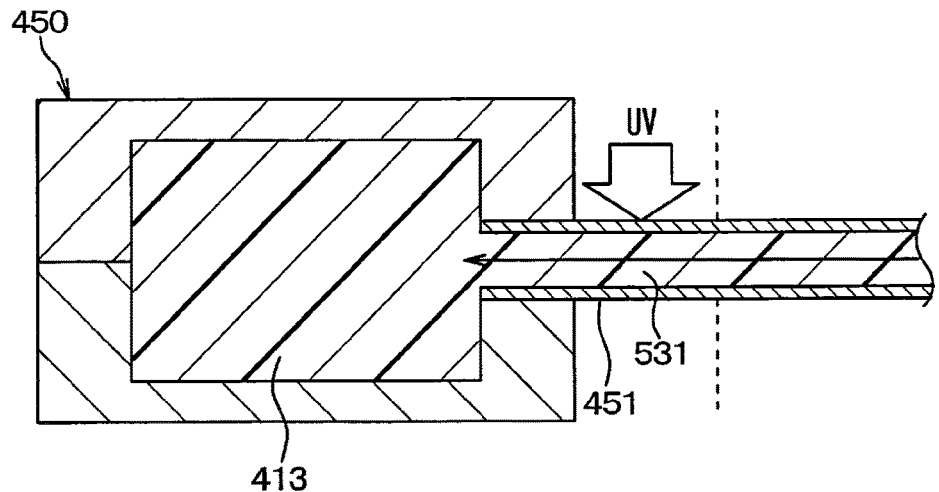
FIG. 12
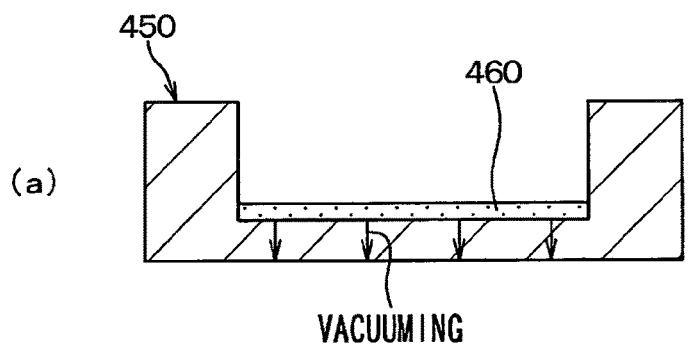
(a)
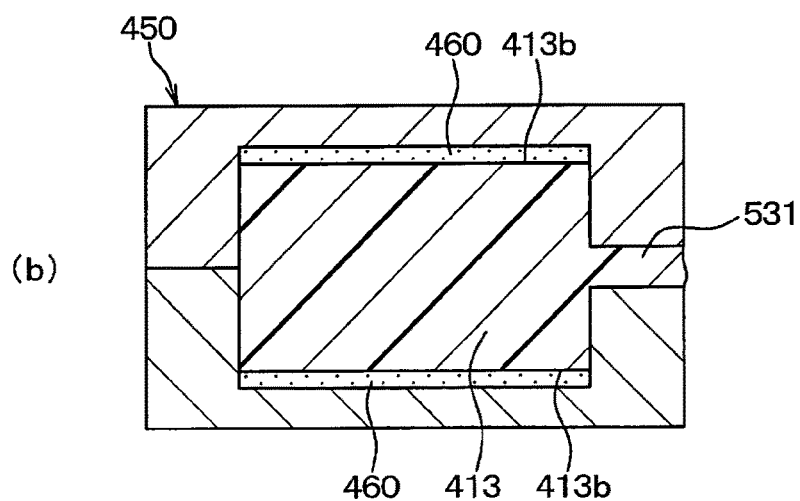
(b)

ically molded outside of the first molded product made of the thermosetting resin.

ELECTRONIC DEVICE AND METHOD FOR MANUFACTURING THE SAME

CROSS REFERENCE TO RELATED APPLICATIONS

The present disclosure is a U.S. national stage application of International Patent Application No. PCT/JP2013/004257 filed on Jul. 10, 2013 and is based on Japanese Patent Application No. 2012-158220 filed on Jul. 16, 2012, Japanese Patent Application No. 2012-265313 filed on Dec. 4, 2012 and Japanese Patent Application No. 2013-32194 filed on Feb. 21, 2013, the contents of which are incorporated herein by reference.

TECHNICAL FIELD

The present disclosure relates to an electronic device, and a method for manufacturing the electronic device.

BACKGROUND

There are electronic devices in which a part or an entirety of an electronic component is covered with a resin molded body, and electronic devices in which an electronic component is fixed to a resin molded body without being coated with the resin molded body. Also, there are electronic devices having an electronic component, a first molded product made of a thermosetting resin that seals the electronic component, and a second molded product made of a thermoplastic resin which is secondarily molded outside of the first molded product.

As a method of manufacturing the electronic device having the resin molded body integrated with the electronic component, there is a method in which a first molded product is primarily molded with the thermosetting resin, and a second molded product to be joined to at least a part of the first molded product is secondarily molded with the thermoplastic resin. The electronic component is integrated with the first molded product.

The reason that the first molded product is molded with the thermosetting resin is because a linear expansion coefficient of the thermosetting resin is close to that of the electronic component, and the thermosetting resin is excellent in a sealing property for sealing the electronic component from the external. The reason that the second molded product is molded with the thermoplastic resin is because the thermosetting resin is high in the dimensional precision of the molded body, and high in toughness.

In the electronic device of this type, the first molded product made of the thermosetting resin is molded previously, and a curing reaction such as cross-linking or polymerization of the thermosetting resin has been completed. Therefore, when the second molded product made of the thermoplastic resin is secondarily molded on the first molded product, adhesion between the thermosetting resin and the thermoplastic resin is low, and peeling may occur therebetween.

Under the circumstances, there is a method in which after the secondary molding has been conducted, a gap between both the molded products is filled with a third resin as an inclusion. However, in this case, a work is required to fill the gap between both those molded products with the inclusion.

On the contrary, as disclosed in PTL 1, there has been proposed means for improving the adhesion in such a manner that the thermoplastic resin is allowed to be present on a surface of the first molded product of the thermosetting resin, and the respective thermoplastic resins are welded together at the time of secondary molding.

However, in the above PTL 1, it is necessary that a prepreg sheet and a thermoplastic resin (PA) film are laminated on each other, and subjected to heat press molding to obtain the first molded product having the thermoplastic resin on a surface thereof, which is not suitable as the means for sealing the electronic components from the viewpoint of component damage.

PTL 2 discloses a pressure sensor having a mold IC integrated with a sensor chip for pressure detection, and a connector case fixed with the mold IC. A mold resin of the mold IC is made of a thermosetting resin, and the connector case is made of a thermoplastic resin. In the pressure sensor, an interface between the mold resin and the connector case is covered with a potting material to prevent the ingress of gas or liquid, that is, to be sealed.

That is, because the thermoplastic resin used for secondary molding is low in adhesion relative to the thermosetting resin, a sealing material such as a potting material is applied to cover the interface between the first molded product and the second molded product after the molding of the second molded product for the purpose of sealing the interface between the first molded product and the second molded product.

However, in this case, a space for holding the applied sealing material must be ensured, or a groove or the like must be formed in the second molded product to prevent outflow of the applied sealing material. Thus, the shapes of the first and second molded products are restricted. Also, in reducing a size of the electronic device, it is preferable not to provide such a space. Therefore, it is desirable to achieve the sealing of the interface without applying the sealing material after the molding of the second molded product.

PTL 3 and PTL 4 disclose a photoresponsive compound that phase transitions from a solid phase or a liquid crystal phase to a liquid phase due to ultraviolet ray irradiation, and phase transitions to a phase before the ultraviolet ray irradiation due to visible light irradiation or heating, and also disclose that the photoresponsive compound is used as an adhesive. However, there is no disclosure of a specific method for achieving the sealing of an interface between the first molded product made of the thermosetting resin and the second molded product made of the thermoplastic resin.

PATENT LITERATURE

PTL 1: JP 2011-166124 A
PTL 2: Japanese Patent No. 3620184
PTL 3: JP 2011-256155 A
PTL 4: JP 2011-256291 A

SUMMARY

The present disclosure has been made in view of the above problems, and a first object of the present disclosure is to provide an electronic device in which a second molded product made of a thermoplastic resin is secondarily molded outside of a first molded product made of a thermosetting resin in which adhesion between both the molded products can be firmly secured through a molding technique such as a transfer molding method or a compression molding method. Also, a second object of the present disclosure is to achieve sealing of the interface between the first molded product made of the thermosetting resin and the second molded product made of the thermoplastic resin even without applying the sealing material after the molding of the second molded product.

According to a first aspect of the present disclosure, there is provided an electronic device including a first molded product integrated with an electronic component; and a second molded product secondarily molded outside of the first molded product. The first molded product includes a thermosetting resin, and a first additive contained in the thermosetting resin, and the second molded product includes a thermoplastic resin, and a second additive contained in the thermoplastic resin and having a reactive group or a skeleton that can joining-react with the first additive. Further, at an interface between the first molded product and the second molded product, the first additive and the second additive are joined to each other by one or more joint actions selected from covalent bonding, ionic bonding, hydrogen bonding, intermolecular forces (van der Waals force), dispersion force, and diffusion.

According to the above configuration, the thermosetting resin forming the first molded product, and the thermoplastic resin forming the second molded product are configured so that the first additive and the second additive contained in the respective molded products are joined to each other by one or more joint actions selected from the covalent bonding, the ionic bonding, the hydrogen bonding, the intermolecular forces (van der Waals force), the dispersion force, and the diffusion. Therefore, the adhesion between both the molded products can be firmly secured through the molding technique such as the transfer molding method or the compression molding method.

According to a second aspect of the present disclosure, there is provided a method for manufacturing an electronic device including a first molded product integrated with an electronic component, and a second molded product secondarily molded outside of the first molded product. The method includes: a first preparation step of preparing a first molding material including a thermosetting resin, and a first additive contained in the thermosetting resin as a raw material of the first molded product; a second preparation step of preparing a second molding material including a thermoplastic resin, and a second additive contained in the thermoplastic resin and having a reactive group or a skeleton that can joining-react with the first additive as a raw material of the second molded product; a first molding step of thermally curing the first molding material to form the first molded product; and a second molding step of arranging the second molding material outside of the first molded product to form the second molded product, and joining the first additive and the second additive on an interface between the first molded product and the second molded product by one or more joint actions selected from covalent bonding, ionic bonding, hydrogen bonding, intermolecular forces (van der Waals force), dispersion force, and diffusion due to a molding heat of the second molded product.

According to the above configuration, the thermosetting resin forming the first molded product, and the thermoplastic resin forming the second molded product are configured so that the first additive and the second additive contained in the respective molded products are joined to each other by one or more joint actions selected from the covalent bonding, the ionic bonding, the hydrogen bonding, the intermolecular forces (van der Waals force), the dispersion force, and the diffusion. Therefore, the adhesion between both the molded products can be firmly secured through the molding technique such as the transfer molding method or the compression molding method.

According to a third aspect of the present disclosure, there is provided an electronic device including a first molded product integrated with an electronic component; and a second molded product including a thermoplastic resin which is secondarily molded outside of the first molded product. The first molded product includes a thermosetting resin, and a first additive resin dispersed in the thermosetting resin and made of a thermoplastic resin. The first additive resin has a glass transition temperature or a softening point lower than a molding temperature of the second molded product, and a pyrolysis temperature higher than the molding temperature of the second molded product, and the first additive resin and the thermoplastic resin of the second molded product are melted and integrated together at an interface between the first molded product and the second molded product.

According to the above configuration, the first additive resin contained in the first molded product has the glass transition temperature or the softening point lower than the molding temperature of the second molded product, and the pyrolysis temperature higher than the molding temperature of the second molded product. Therefore, the first additive resin present on a surface of the first molded product is melted, and mixed with the thermoplastic resin melted on the second molded product side at the time of secondary molding, and melted and integrated together after the secondary molding. For that reason, the adhesion between both the molded products can be firmly secured through the molding technique such as the transfer molding method or the compression molding method.

According to a fourth aspect of the present disclosure, there is provided a method for manufacturing an electronic device including a first molded product integrated with an electronic component, and a second molded product including a thermoplastic resin which is secondarily molded outside of the first molded product. The method includes: a first preparation step of preparing a first molding material including a thermosetting resin, and a first additive resin dispersed in the thermosetting resin and made of a thermoplastic resin as a raw material of the first molded product, in which the first additive resin has a glass transition temperature or a softening point lower than a molding temperature of the second molded product, and a pyrolysis temperature higher than the molding temperature of the second molded product; a second preparation step of preparing a second molding material including a thermoplastic resin as a raw material of the second molded product; a first molding step of thermally curing the first molding material to form the first molded product; and a second molding step of arranging the second molding material outside of the first molded product to form the second molded product, and melting the first additive resin and the thermoplastic resin of the second molded product at an interface between the first molded product and the second molded product due to a molding heat of the second molded product to integrate the first additive resin and the thermoplastic resin of the second molded product.

According to the above configuration, the first additive resin contained in the first molded product has the glass transition temperature or the softening point lower than the molding temperature of the second molded product, and the pyrolysis temperature higher than the molding temperature of the second molded product. Therefore, the first additive resin present on a surface of the first molded product is melted, and mixed with the thermoplastic resin melted on the second molded product side in the second molding step, and melted and integrated together after the secondary molding. For that reason, the adhesion between both the molded products can be firmly secured through the molding technique such as the transfer molding method or the compression molding method.

According to a fifth aspect of the present disclosure, there is provided a method for manufacturing an electronic device, including: a first molded product preparation step of preparing a first molded product on a surface of which a photoresponsive compound that phase transitions from a solid phase or a liquid crystal phase to a liquid phase due to ultraviolet ray irradiation, and phase transitions from the liquid phase to a phase before the ultraviolet ray irradiation due to visible light irradiation or heating is present, in which the photoresponsive compound is phase transitioned to the liquid phase by the ultraviolet ray irradiation; a second molded product molding step of molding a second molded product by injecting a liquid thermoplastic resin into a mold die, and bringing the liquid thermoplastic resin into contact with a surface of the first molded product in a state where the first molded product is installed within the mold die, and solidifying the liquid thermoplastic resin; and a phase transition step of allowing the photoresponsive compound to phase transition from the liquid phase to the solid phase or the liquid crystal phase by subjecting the surface of the first molded product which comes in contact with the second molded product to visible light irradiation or heating after injecting the liquid thermoplastic resin into the mold die.

According to the above configuration, the thermoplastic resin is solidified after the liquid phase photoresponsive compound present on the surface of the first molded product is mixed with the liquid thermoplastic resin in the second molded product molding step, and the photoresponsive compound phase transitions to the liquid crystal phase lower in fluidity than the solid phase or the liquid phase in the phase transition step to join the first molded product and the second molded product.

For that reason, the sealing of the interface between the first molded product made of the thermosetting resin and the second molded product made of the thermoplastic resin can be achieved even without applying the sealing material after the molding of the second molded product.

BRIEF DESCRIPTION OF DRAWINGS

The above and other objects, features and advantages of the present disclosure will become more apparent from the following detailed description made with reference to the accompanying drawings. In the drawings.

Figure 8:
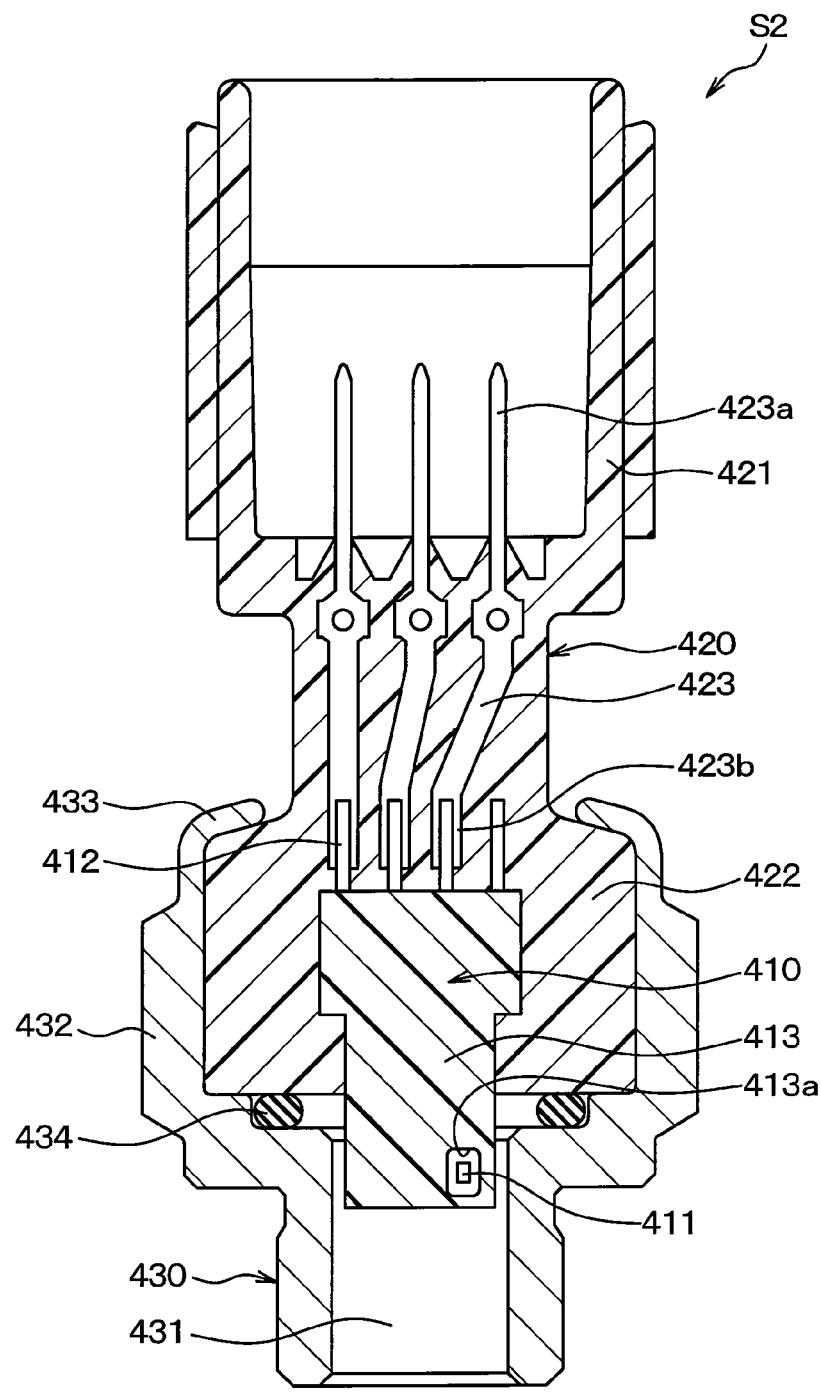
FIG. 8 is a diagram illustrating a schematic cross-sectional configuration of a pressure sensor as an electronic device according to a fourth embodiment of the present disclosure.
Figure 9:
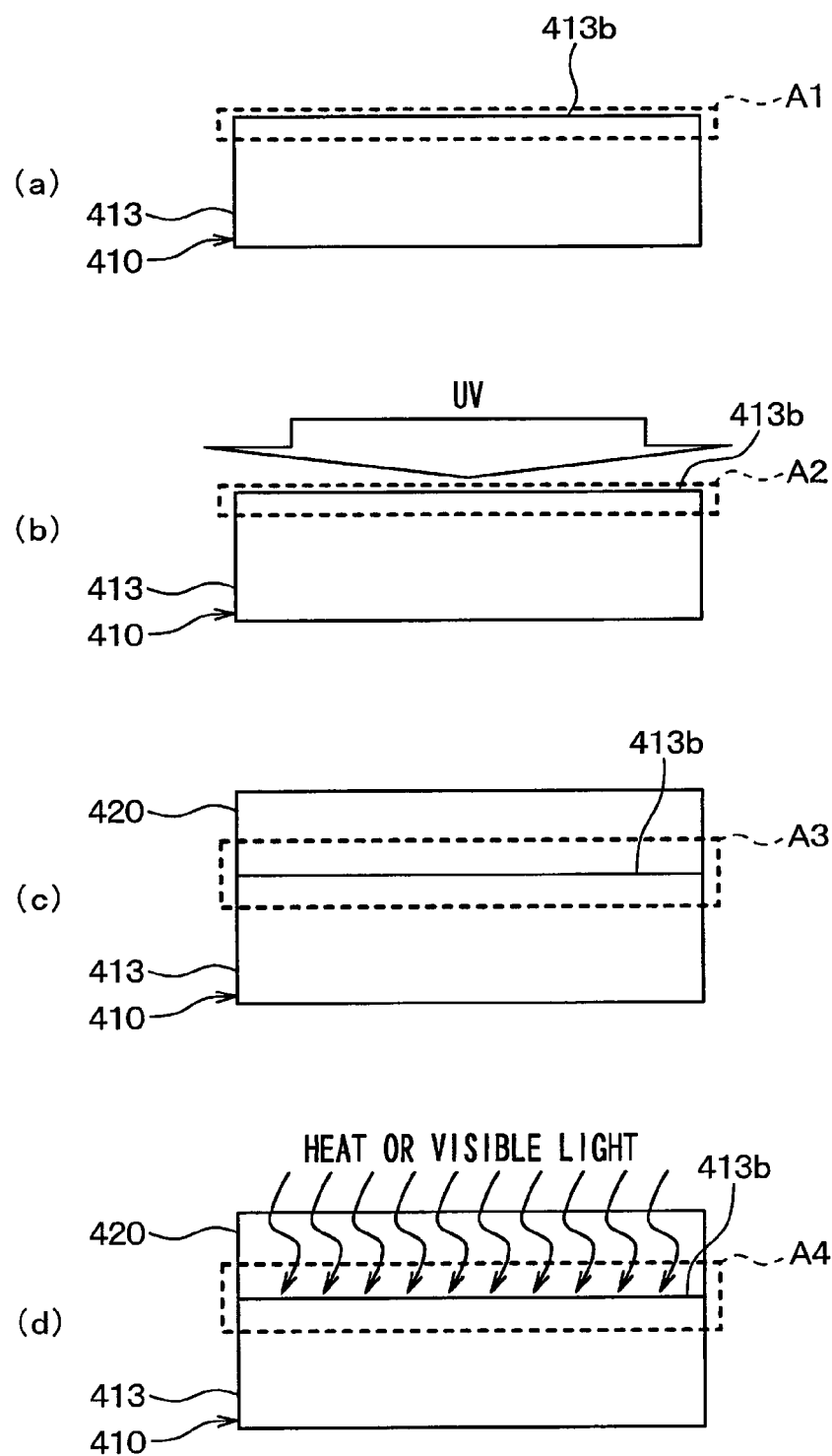

(a) to (d) of FIG. 9 are diagrams illustrating a process of manufacturing the pressure sensor illustrated in FIG. 8.

Figure 10:
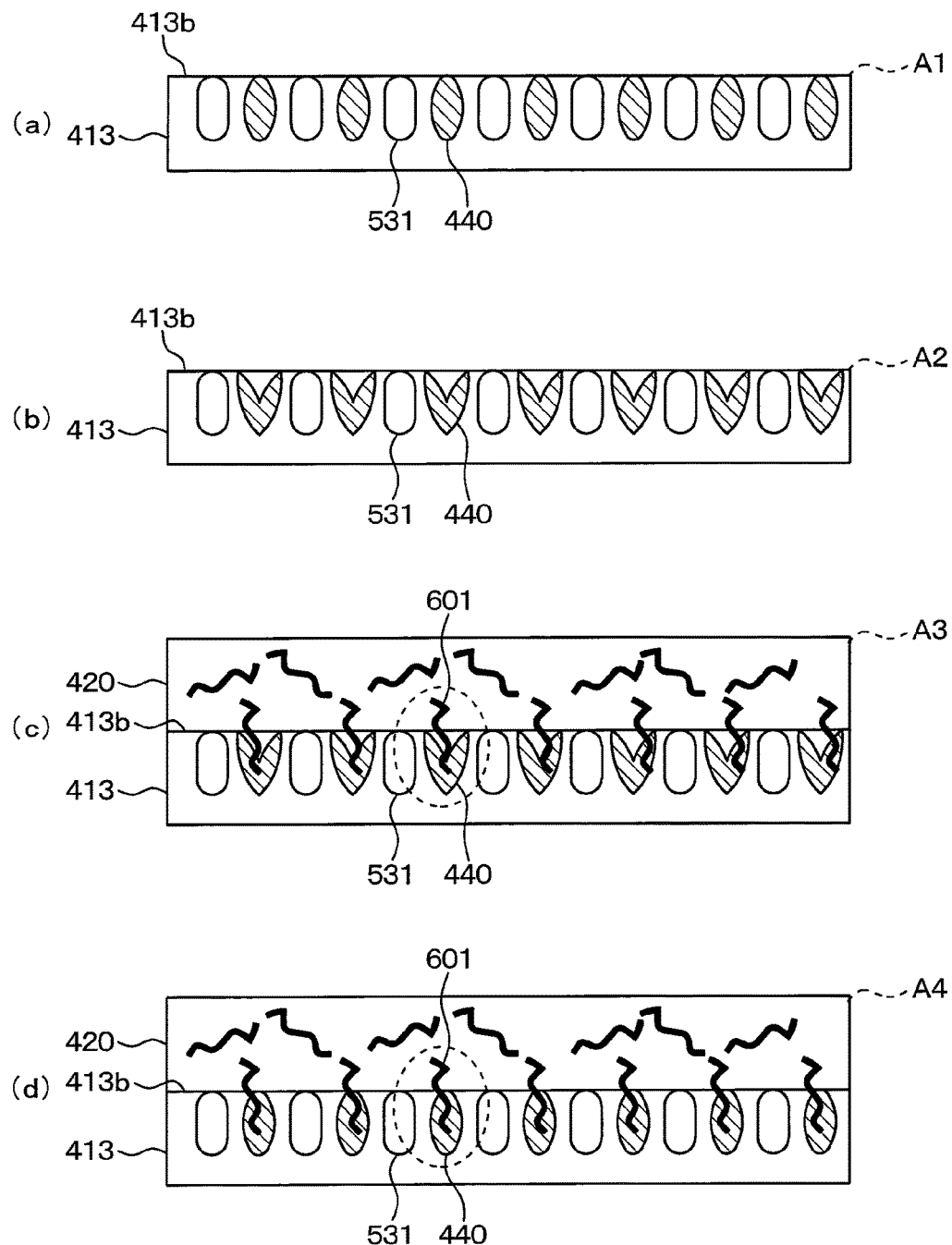

(a) to (d) of FIG. 10 are diagrams schematically illustrating areas A1 to A4 in (a) to (d) of FIG. 9, respectively.

FIG. 11 is a diagram illustrating a part of a process of manufacturing a pressure sensor as an electronic device according to a fifth embodiment of the present disclosure.

(a) and (b) of FIG. 12 are diagrams illustrating a part of a process of manufacturing a pressure sensor as an electronic device according to a sixth embodiment of the present disclosure.

Figure 13:
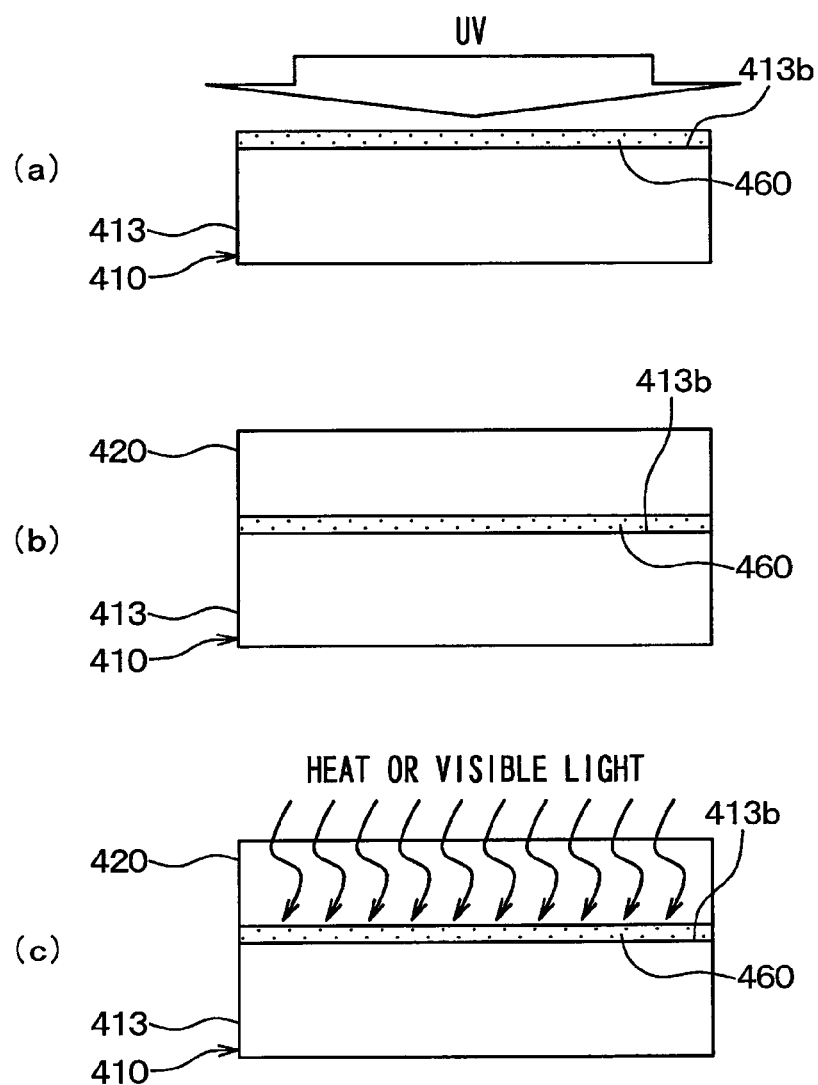

(a) to (c) of FIG. 13 are diagrams illustrating a process of manufacturing the pressure sensor subsequent to FIG. 12.

Figure 14:
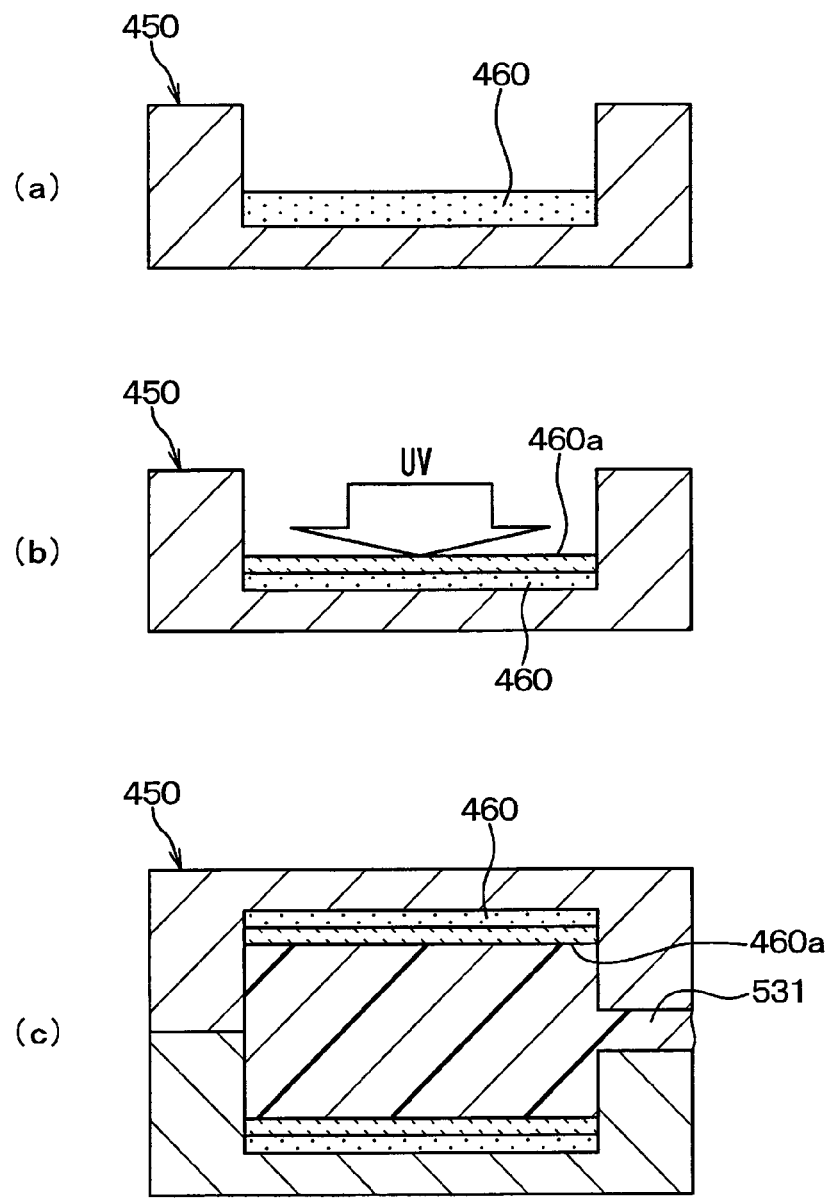

(a) to (c) of FIG. 14 are diagrams illustrating a part of a process of manufacturing a pressure sensor as an electronic device according to a seventh embodiment of the present disclosure.

DETAILED DESCRIPTION

Hereinafter, embodiments of the present disclosure will be described with reference to the accompanying drawings. Further, in the following respective drawings, portions which are the same as or equivalent to each other are denoted by the same reference numerals in the drawings for simplifying the description.

First Embodiment

An electronic device according to a first embodiment of the present disclosure will be described with reference to FIG. 1. The electronic device according to the present embodiment roughly includes a first molded product 10 that seals an electronic component 30, and a second molded product 20 secondarily molded outside of the first molded product 10.

First, the electronic component 30 is formed of a passive element such as an IC chip or a capacitor, and the electronic component 30 is mounted on a lead frame 40 through a die bond material not shown. In this example, the lead frame 40 is formed into a typical plate-like shape made of Cu or 42 alloy. Also, the electronic component 30 and the lead frame 40 are wired to each other by a bonding wire 50 made of gold or aluminum, and electrically connected to each other.

The first molded product 10 is mainly made of a thermosetting resin, and molded through a transfer molding method. The thermosetting resin forming the first molded product 10 may be mixed with a filler made of silica or the like from the viewpoint of regulating a linear expansion coefficient.

In this example, the electronic component 30, the lead frame 40, and the bonding wire 50 are sealed with the first molded product 10, and a portion of the lead frame 40 on an opposite side to the electronic component 30 projects from the first molded product 10.

A projecting part of the lead frame 40 from the first molded product 10 is connected with one end of a terminal pin 60 by welding or the like. The terminal pin 60 is formed into a rod-like shape made of a Cu-based metal, and electrically connects the electronic component 30 and the lead frame 40 to the external.

The second molded product 20 is mainly made of a thermoplastic resin, and formed by injection molding. The second molded product 20 is disposed to seal an outside of the first molded product 10 in a state where the second molded product 20 comes in direct contact with an outer surface of the first molded product 10 with respect to a part of the first molded product 10.

At the same time, the second molded product 20 seals a welded portion of the lead frame 40 and the terminal pin 60. In this way, the second molded product 20 and the terminal pin 60 form a connector member for performing an electric connection with the external in this electronic device.

The other end of the terminal pin 60 is exposed to an opening 221 formed in the second molded product 20. The opening 221 is formed as a socket in the connector member. That is, the second molded product 20 is fitted to an external wiring member in the opening 221, and the terminal pin 60 is connected to the external wiring member.

In this example, the first molded product 10 includes the above-described thermosetting resin, and a first additive contained in the thermosetting resin. The second molded product 20 includes the above-described thermoplastic resin, and a second additive contained in the thermoplastic resin, and having a reactive group or a skeleton that can joining-react with the first additive.

In the interface between the first molded product 10 and the second molded product 20, the first additive and the second additive are joined to each other by one or more joint actions selected from covalent bonding, ionic bonding, hydrogen bonding, intermolecular forces (van der Waals force), dispersion force, and diffusion. In this example, an interaction such as the covalent bonding represents one or more interactions selected from the covalent bonding, the ionic bonding, the hydrogen bonding, the intermolecular forces (van der Waals force), the dispersion force, and the diffusion. This joint is caused by a molding heat at the time of secondary molding for forming the second molded product 20.

In this way, according to this electronic device, the first additive contained in the thermosetting resin of the first molded product 10 and the second additive contained in the thermoplastic resin of the second molded product 20, respectively, are joined to each other by one or more joint actions selected from the covalent bonding, the ionic bonding, the hydrogen bonding, the intermolecular forces (van der Waals force), the dispersion force, and the diffusion. Therefore, the adhesion between both the molded products 10 and 20 can be firmly secured through a primary molding technique such as the transfer molding method or the compression molding method which is suitable for sealing the electronic components.

A method for manufacturing the electronic device described above will be described below. First, a first molding material including a thermosetting resin, and a first additive contained in the thermosetting resin is prepared as a raw material of the first molded product 10 (first preparation step).

Also, a second molding material including a thermoplastic resin, and a second additive contained in the thermoplastic resin and having a reactive group or a skeleton that can joining-react with the first additive is prepared as a raw material of the second molded product 20 (second preparation step).

In addition, the first molding material is thermally cured so as to seal the electronic component 30 to form the first molded product 10 (first molding step). In the present embodiment, the electronic component 30 is mounted on the lead frame 40 to form the bonding wire 50 by wire bonding. In addition, the product is placed into a primary molding mold die not shown to form the first molded product 10 through the transfer molding method.

Next, the projecting part of the lead frame 40 from the first molded product 10 is connected to one end of the terminal pin 60 by welding, or the like. This product is placed into a secondary molding mold die not shown.

In addition, in a second molding step, the second molding material is arranged outside of the first molded product 10 so as to come the second molding material into direct contact with the outer surface of the first molded product 10 to form the second molded product 20. At the same time, the first additive and the second additive are joined to each other on an interface between the first molded product 10 and the second molded product 20 by one or more joint actions selected from covalent bonding, ionic bonding, hydrogen bonding, intermolecular forces (van der Waals force), dispersion force, and diffusion due to a molding heat of the second molded product 20.

In this way, the second molded product 20 is formed to complete the connector member, and the electronic device according to the present embodiment is completed. It is needless to say that as the above-mentioned mold dies not shown, mold dies having cavities corresponding to contours of the respective final molded products 10 and 20 are used.

In this electronic device, after the electronic component 30 has been sealed with the first molded product 10 made of the thermosetting resin once, the electronic component 30 is further sealed with the second molded product 20 made of the thermoplastic resin. If the electronic component 30 mounted on the lead frame 40 and connected to the lead frame 40 by the bonding wire 50 is directly sealed with the thermoplastic resin, the component may be likely to be damaged such that the bonding wire 50 streams by the thermoplastic resin with high viscosity.

In order to avoid such a drawback, for the purpose of preventing an damage on the component, the electronic component 30 is first sealed with the first molded product 10 made of the thermosetting resin, and thereafter an outside of the first molded product 10 is sealed with the second molded product 20 made of the thermoplastic resin.

Further, since the thermosetting resin of the first molded product 10 is made by reacting a base material and a curing agent with each other, it is desirable that the base material and the curing agent are mixed together at a ratio shifted from an equivalent ratio (10:10) in the first molded product 10 of the present embodiment.

With the above configuration, in the first molded product 10, a surplus material of the base material and the curing agent becomes the first additive. The second additive in the second molded product 20 may have a reactive group or a skeleton that can joining-react with the first additive as the surplus material.

In this case, if the base material or the curing agent in the thermosetting resin where the base material and the curing agent chemically react with each other is regarded as the surplus material, and set as the first additive, another material except for the base material and the curing agent is not prepared as the first additive, and the configuration can be simplified.

For example, when the base material in the base material and the curing agent of the thermosetting resin forming the first molded product 10 is set to the first additive as the surplus material, the second additive in the second molded product 20 may be the same base material or curing agent as the base material in the first molded product 10 if the second additive reacts with the base material, and further may be a resin of different type from that of the base material and the curing agent in the first molded product 10.

Also, for example, when the curing agent in the base material and the curing agent of the thermosetting resin forming the first molded product 10 is set to the first additive as the surplus material, the second additive may be the same base material as the base material in the first molded product 10 if the second additive reacts with the curing agent, and further may be a resin of different type from that of the base material in the first molded product 10.

Specifically, as the base material of the thermosetting resin forming the first molded product 10, there are epoxy resin, phenol resin, and unsaturated polyester resin, which are excellent in moisture resistance, chemical resistance, dimensional stability, electricity, machinery, and thermal characteristics. Among those materials, the epoxy resin is preferable taking versatility and sealing property in account.

Also, as the curing agent of the thermosetting resin forming the first molded product 10, there are usual compounds having an amino group ($NH_2$ group) or hydroxyl group (OH group). The base material and the curing agent may be used as the first additive and the second additive for the above surplus material.

Also, as the thermoplastic resin forming the second molded product 20, there are PPS (polyphenylene sulfide), PBT (polybutylene terephthalate), PES (polyether sulfone), PC (polycarbonate), and phenoxy resins, which are excellent in moisture resistance, chemical resistance, dimensional stability, electricity, machinery, and thermal characteristics. The first additive and the second additive chemically react with each other due to the molding heat of the second molded product 20, and an ordinal skilled person in the chemical field can easily select the thermoplastic resin taking the chemical reaction of both the additives into account. Therefore, various combinations other than the above materials are enabled.

Subsequently, a description will be given of the first embodiment with reference to the following respective examples in more detail.

Example 1

Figure 2:
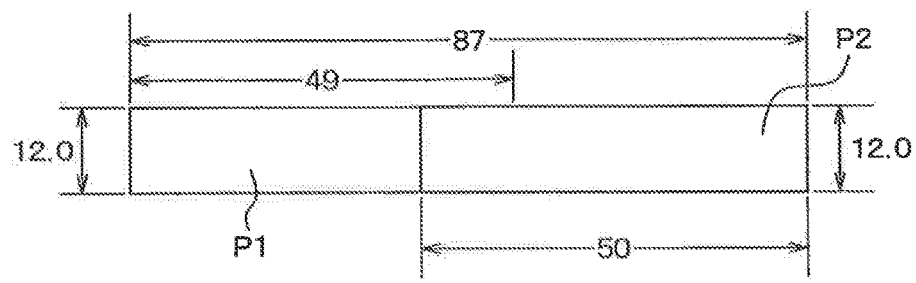
FIG. 2 is a diagram illustrating a schematic planar configuration of molded articles according to an example 1 of the present disclosure.
Figure 3:
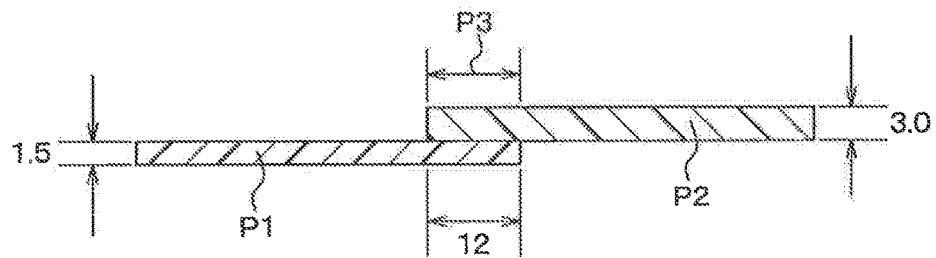
FIG. 3 is a diagram illustrating a schematic cross-sectional configuration of the molded articles according to the example 1 of the present disclosure.

In this example, as illustrated in FIGS. 2 and 3, molded articles P1 and P2 in which a plate piece P1 as the first molded product 10, and a plate piece P2 as the second molded product 20 both of which are shaped into an elongate plate come in close contact with each other while partially overlapping with each other, are prepared, and a peeling test is conducted on the molded articles P1 and P2 to confirm a joint strength of an adhesion portion P3.

In FIGS. 2 and 3, an example of dimensions (unit: mm) of the respective portions of the plate pieces P1 and P2, and the adhesion portion P3 are illustrated. When the dimensional example is described, the plate piece P1 is 49 mm in length, 12.0 mm in width, and 1.5 mm in thickness, and the plate piece P2 is 50 mm in length, 12.0 mm in width, and 3.0 mm in thickness. A length of the adhesion portion P3 is 12 mm.

[Preparation of First Molding Material] Bisphenol A type epoxy resin (epoxy equivalent 188) which is the base material, and amine curing agent (Hereinafter referred to as PPS backbone amine) having a PPS skeleton are mixed together at 10:7 with respect to the equivalent ratio of 10:10. Further, spherical silica of 10 micron in average particle diameter is mixed with the first molding material at a silica ratio of 75 wt % with the overall first molding material as 100 wt %. This material is kneaded by an open roll of 100° C. for five minutes to obtain a thermosetting composition as the first molding material. In this example, bisphenol A type epoxy resin which is the surplus material corresponds to the first additive.

A method of preparing the PPS backbone amine in this example will be described below. With NN-dimethylacetamide as a reaction solvent, dithiodipyridine polyphenylene sulfide and p-chloronitrobenzene are charged at a ratio of SH group:Cl group=1:1.1 on the equivalent ratio basis. After heating to 60° C., potassium carbonate is added at a ratio of SH:potassium carbonate=1:1.1 on the equivalent ratio basis, and thereafter reaction is conducted at 120° C. for five hours. The reaction solution is introduced into ion-exchanged water to perform reprecipitation to obtain a solid by filtration. Further, after the solid has been washed with hot ethanol, the solid is dried to obtain phenylene sulfide oligomers having a nitro group at both ends thereof.

With Isopropyl alcohol as a reaction solvent, phenylene sulfide oligomers having a nitro group and palladium carbon (weight ratio, phenylene sulfide oligomers having a nitro group:palladium on carbon=1:0.05) are charged. After heating to 70° C., hydrazine hydrate (nitro group:hydrazine hydrate=1:4 at equivalent ratio) is added over one hour. Further, reaction is conducted at 80° C. for five hours, and nitro group of the terminal is reduced to the amino group. After the palladium carbon has been removed by filtration at the thermal time, the solid is precipitated by cooling. After the solid has been extracted by filtration, the solid is dried to obtain phenylene sulfide oligomers having an amino group at both ends thereof. Phenylene sulfide oligomers having an amino group at both ends thereof are PPS backbone amine.

[Preparation of Second Molding Material] Phenoxy resin YP50 (trade name) by Nippon Steel Chemical Co., Ltd. Sumitomo Metal of 5 wt % is blended into PPS Z230 (trade name) made by DIC under the conditions of 290° C. and 200 rpm with the use of a biaxial kneader to obtain a thermoplastic composition as the second molding material. In this example, phenoxy resin corresponds to the second additive.

[Primary Molding] After the thermosetting composition has been molded into a shape of the plate piece P1 illustrated in FIGS. 2 and 3 by transfer molding, the composition is cured in a curing step at 180° C. for three hours to obtain an intended plate piece P1.

[Secondary Molding] The plate piece P1 is secondarily molded with the above second molding material under the conditions in which a molding temperature is 320° C., a mold die temperature is 130° C., a filling time is 0.5 sec (30 mm/sec), injection/cooling is 15 sec/15 sec, and a holding pressure is 50 MPa. As a result, the plate piece P2 joined to the plate piece P1 in this example 1 is prepared.

[Confirmation of Joint Strength] As a comparative example, articles identical with the molded articles P1 and P2 illustrated in FIGS. 2 and 3 are prepared with the use of the mixture of bisphenol A type epoxy resin and PPS backbone amine at the equivalent ratio (=10:10) as the first molding material. In this case, bisphenol A type epoxy resin that is the first additive reacts with phenoxy resin that is the second additive.

The joint strength of the adhesion portion P3 is confirmed by a tension strength in a longitudinal direction of both the plate pieces P1 and P2, that is, a horizontal direction of FIGS. 2 and 3. As a result, in a molded product of the comparative example, peeling occurs in the adhesion portion P3 with a slight force whereas in the molded product of this example, no peeling occurs therein, and the plate piece P1 is destroyed instead. In this way, in this example 1, a remarkable improvement in the strength is confirmed.

Example 2

The molded articles P1 and P2 are prepared in the same procedure as that in the above example 1 except for the use of the mixture of bisphenol A type epoxy resin and PPS backbone amine at 7:10 with respect to the equivalent ratio of 10:10 as the first molding material. In this case, the first additive is PPS backbone amine which is the surplus material, and phenoxy resin which is the second additive of the second molding material reacts with PPS backbone amine. Also, in this example 2, a remarkable improvement in the strength is confirmed as in the example 1.

Example 3

The molded articles P1 and P2 are prepared as in the same manner as that in the above examples 1 and 2 except that, in the examples 1 and 2, PPS backbone amine is replaced with phenolic curing agent (OH equivalent 104) TD2131 made by DIC, and Triphenylphosphine of 0.2 phr is added as catalyst to prepare the plate piece P1. Also, in this example 3, a remarkable improvement in the strength is confirmed as in the example 1.

In the above examples 1 to 3, bisphenol A type epoxy resin is used as the thermosetting resin of the first molded product 10. Instead, general-purpose multi-functional epoxy resin may be used, and an improvement in the strength can be expected in this case.

Second Embodiment

A second embodiment of the present disclosure will be described. The present embodiment describes an applied example to a pressure sensor S1 mounted on a vehicle as an electronic device. The pressure sensor S1 detects a pressure (intake pressure) of air sucked into an engine, or a pressure of fuel supplied to the engine. First, the pressure sensor S1 will be described with reference to FIG. 4.

Figure 4:
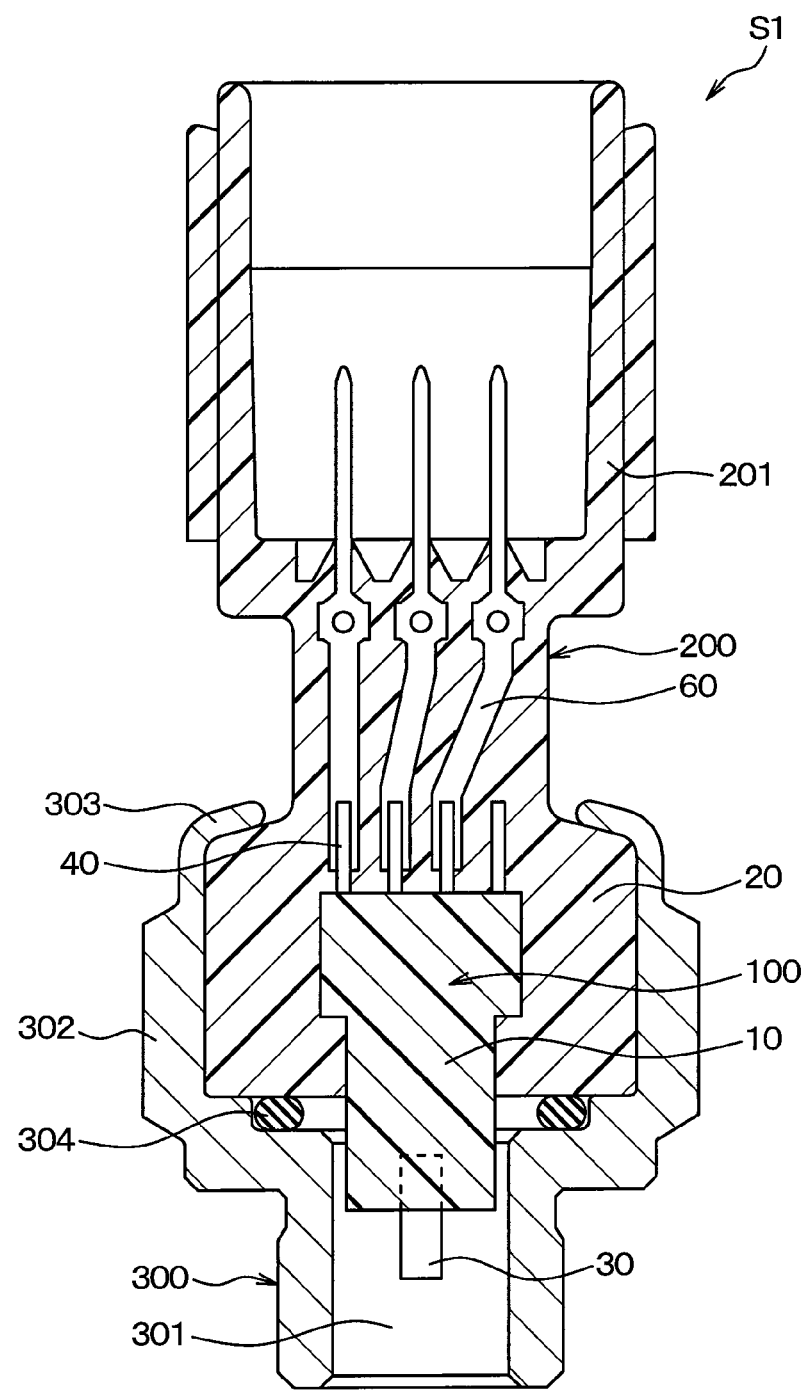
FIG. 4 is a diagram illustrating a schematic cross-sectional configuration of a pressure sensor as an electronic device according to a second embodiment of the present disclosure.

As illustrated in FIG. 4, the pressure sensor S1 includes a mold IC 100, a connector case 200, and a housing 300. The mold IC 100 includes a sensor chip 30 as the electronic component, a lead frame 40, and a mold resin 10, and the sensor chip 30 is integrated with the mold resin 10.

The sensor chip 30 is configured by a diaphragm or the like to detect a pressure, and has one end portion which performs the detection and is projected from the mold resin 10, and the other end portion sealed with the mold resin 10.

The lead frame 40 is electrically connected to the sensor chip 30 through a bonding wire not shown within the mold resin 10. One end portion of the lead frame 40 is exposed from the mold resin 10.

The mold resin 10 is a first molded product molded with a thermosetting resin such as an epoxy resin, and formed through a primary molding technique such as the transfer molding method or the compression molding method. A detail of the mold resin 10 will be described later.

The mold resin 10 covers and seals most of the lead frame 40. Also, although not shown, a signal processing circuit IC and the like as the electronic component is incorporated into the mold resin 10.

The connector case 200 is provided with the connector resin part 20 as a base. The connector resin part 20 corresponds to the second molded product, and is made of resin mainly containing the thermoplastic resin such as PPS (polyphenylene sulfide) or PBT (polybutylene terephthalate).

The connector case 200 includes the connector resin part 20, and the terminal pins 60 sealed with the connector resin part 20. One end of each terminal pins 60 is electrically connected to one end portion of the corresponding lead frame 40 exposed from the mold resin 10.

A connection portion of the terminal pins 60 and the lead frames 40, and an outside of the mold resin 10 are sealed with the connector resin part 20. A sealed portion of the mold resin 10 with the connector resin part 20 comes in direct contact with the connector resin part 20. Also, a part of the mold resin 10 adjacent to the sensor chip 30 is exposed from the connector resin part 20.

Also, the other end side of the terminal pins 60 is exposed within a connector part 201 of the connector case 200 on a side opposite to the connector resin part 20. The other end side of the exposed terminal pins 60 is electrically connected to the external.

The mold IC 100 and the connector case 200 are formed through a molding method such as the transfer molding method or the compression molding method. As will be described later in detail, specifically, a method is applied in which after the mold resin 10 is primarily molded by thermal curing with the use of a mold die, the connector resin part 20 is secondarily molded on the outside of the mold resin 10 through thermoforming with the use of the mold die.

The housing 300 is a case made of metal which is coupled with the connector case 200. The housing 300 includes a pressure introduction passage 301 that introduces a pressure medium into the sensor chip 30, and an accommodation part 302 that accommodates a part of the connector case 200. The pressure introduction passage 301 is configured as a hollow part of the housing 300. The accommodation part 302 is formed on a portion opposite to the pressure introduction passage 301 as an opening.

The housing 300 is coupled with the connector case 200 by swaging a part 303 of the housing 300 in a state where a portion of the connector case 200 adjacent to the mold IC 100 is accommodated within the accommodation part 302. An O-ring 304 intervenes between the housing 300 and the connector case 200, and a space between the housing 300 and the connector case 200 is sealed with the O-ring 304.

The pressure sensor S1 according to the present embodiment is further configured for the mold resin 10 and the connector resin part 20 as follows.

Figure 5A:
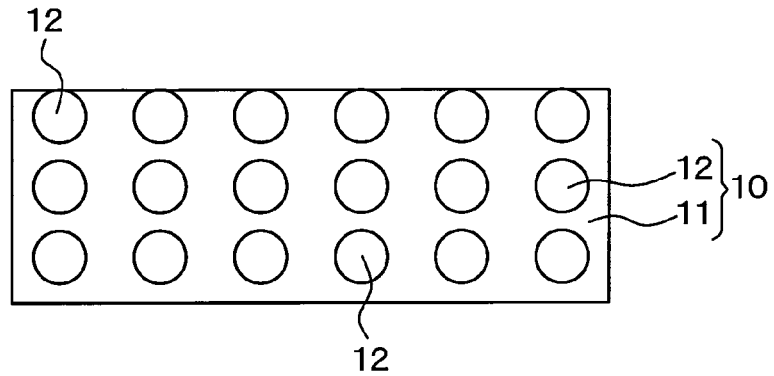
FIG. 5A is a diagram schematically illustrating an interior of a mold resin according to the second embodiment.
Figure 5B:
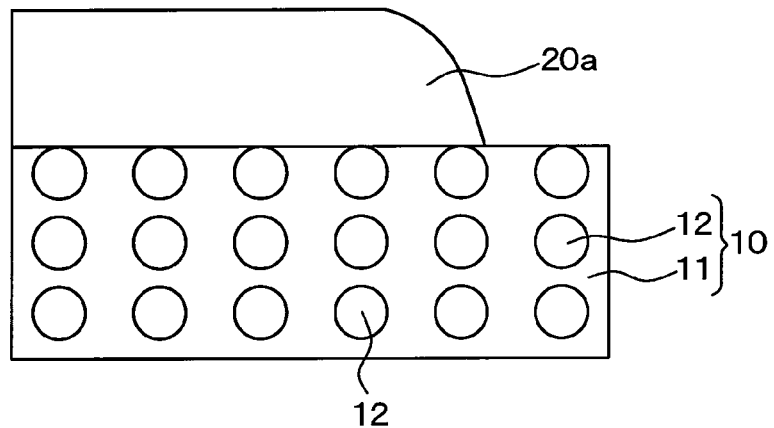
FIG. 5B is a diagram schematically illustrating a state in which a material of a connector resin part is arranged on the mold resin illustrated in FIG. 5A.
Figure 5C:
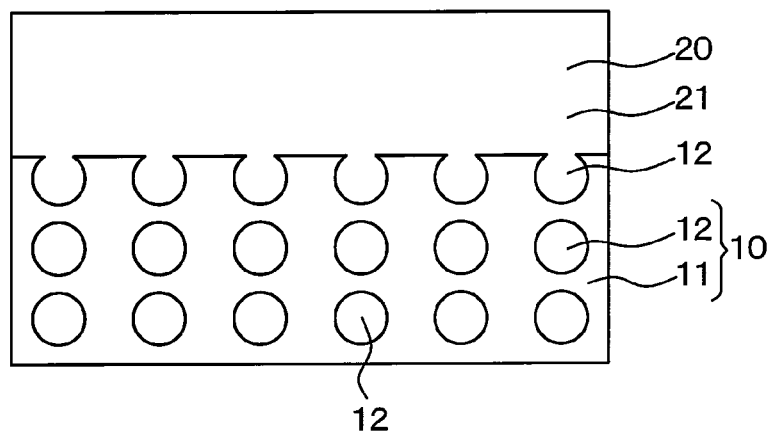
FIG. 5C is a diagram schematically illustrating the vicinity of an interface between the mold resin and the connector resin part in the second embodiment.

As illustrated in FIGS. 5A and 5C, the mold resin 10 which is the first molded product includes a thermosetting resin 11 such as epoxy resin, and a first additive resin 12 mixedly dispersed in the thermosetting resin 11. In this example, an inorganic filler or the like is mixed in the thermosetting resin 11 for the purpose of regulating a linear expansion coefficient as occasion demands.

The first additive resin 12 is a thermoplastic resin, and has a glass transition temperature or a softening point lower than a molding temperature of the connector resin part 20 that is the second molded product, and has a pyrolysis temperature higher than the molding temperature of the connector resin part 20. For example, if the connector resin part 20 is made of PPS, the molding temperature thereof is about 300 to 340° C.

Figure 6A:
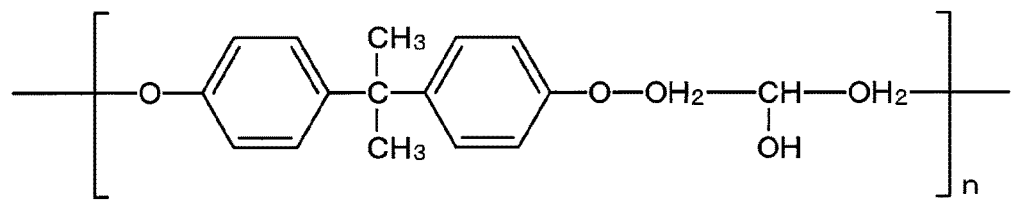
FIG. 6A is a diagram schematically illustrating a chemical structural formula of phenoxy resin as an additive resin.

As the thermoplastic resin of the first additive resin 12 described above, there are phenoxy resin and thermoplastic epoxy resin. The phenoxy resin has a chemical structure illustrated in FIG. 6A, and has a softening point of about 65 to 160° C., and a pyrolysis temperature of about 350° C.

Figure 6B:
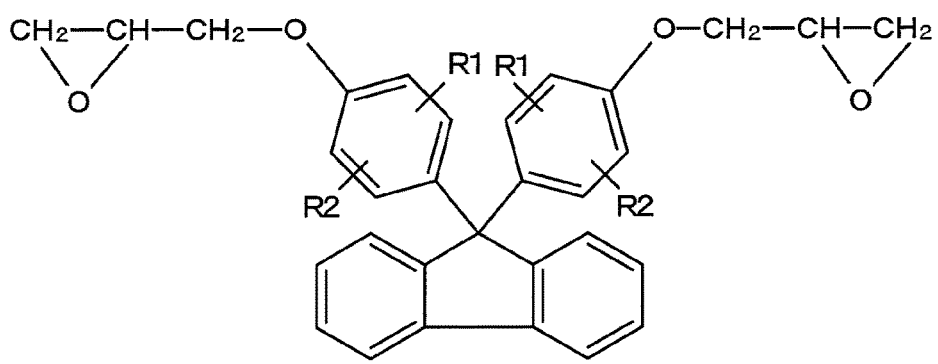
FIG. 6B is a diagram illustrating a chemical structural formula of a part of a thermoplastic epoxy resin as the additive resin.
Figure 6C:
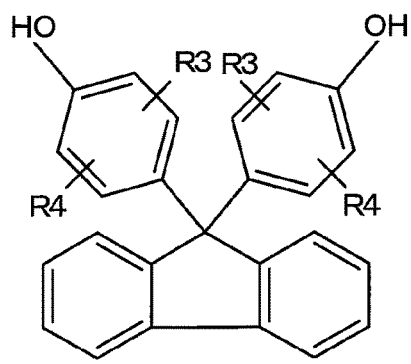
FIG. 6C is a diagram illustrating a chemical structural formula of a part of a thermoplastic epoxy resin as the additive resin.

Also, the thermoplastic epoxy resin is typically a resin in which a component represented in FIG. 6B and a component represented in FIG. 6C are mixed together. In this example, R1 to R4 in FIGS. 6B and 6C are hydrogen or an alkyl group. The thermoplastic epoxy resin has a softening point of about 80 to 150° C., and a remarkable pyrolysis temperature of about 350° C.

The mold resin 10 is brought in a dispersed and mixed state by allowing the thermosetting resin 10 and the first additive resin 12 to be kneaded in a powder state, or mixed in a solution state. In this example, a mixing ratio of the thermosetting resin 10 and the first additive resin 12 is 99:1 to 1:99 in weight ratio, and particularly at a compounding ratio where the amount of first additive resin 12 is larger than that at 80:20, components corresponding to a sea and an island in a sea-island structure in a phase structure of a cured product are replaced with each other, and the sea (matrix component) forms the first additive resin 12. Therefore, this mixing ratio becomes a state superior in welding, and is preferable.

As illustrated in FIG. 5C, on an interface between the mold resin 10 and the connector resin part 20, the first additive resin 12 and the thermoplastic resin 21 of the connector resin part 20 are melted and integrated together. In this example, since the first additive resin 12 made of the phenoxy resin or the thermoplastic epoxy resin has a compatibility with the thermoplastic resin 21 of the connector resin part 20 made of PPS or PBT, the first additive resin 12 is melted by the molding heat, and integrated with the thermoplastic resin 21 on the interface.

Subsequently, a method of manufacturing the pressure sensor S1 will be described. First, as a raw material of the mold resin 10 that is the first molded product, a first molding material including the thermosetting resin 11, and the first additive resin 12 dispersed in the thermosetting resin is prepared (first preparation step). The first molding material is prepared by kneading the above powder or mixing the solution. On the other hand, as a raw material of the second molded product, a second molding material 20a (refer to FIG. 5B) including the thermoplastic resin is prepared (second preparation step).

In addition, the first molding material is thermally cured so as to seal the sensor chip 30 which is an electronic component to form the mold resin 10 as the first molded product (first molding step). Specifically, the electronic component 30 is mounted on the lead frame 40, and this product is placed into a primary molding mold die not shown to mold the mold resin 10 through the transfer molding method. In this way, the mold resin 10 illustrated in FIG. 5A can be completed.

Subsequently, a workpiece in which the lead frames 40 and the terminal pins 60 are connected to each other by welding or the like is formed, and then a second molding process is performed as illustrated in FIGS. 5B and 5C. In the second molding step, the workpiece is placed into a secondary molding mold die not shown.

In addition, in the second molding step, a second molding material 20a is arranged outside of the mold resin 10 and the terminal pins 60 to be covered, and heated and molded to form the connector resin part 20 as the second molded product.

Also, in the second molding step, the first additive resin 12 in the mold resin 10, and the thermoplastic resin 21 of the connector resin part 20 are melted together by the molding heat. For that reason, as illustrated in FIG. 5C, on the interface between the mold resin 10 and the connector resin part 20, the first additive resin 12, and the thermoplastic resin 21 of the connector resin part 20 are integrated together in a liquid state.

In this way, through the second molding step, the connector resin part 20 is formed, and the mold resin 10 and the connector resin part 20 are also joined to each other on the interface between those elements 10 and 20. As a result, the pressure sensor S1 according to the present embodiment is completed.

Incidentally, according to the present embodiment, the first additive resin 12 contained in the mold resin 10 has the glass transition temperature or the softening point lower than the molding temperature of the connector resin part 20, and the pyrolysis temperature higher than the molding temperature of the connector resin part 20

For that reason, in the second molding step, the first additive resin 12 present on the surface of the mold resin 10 is melted, and mixed with the thermoplastic resin 21 melted on the connector resin part 20 side, and melted and integrated together after the secondary molding. Further, the first additive resin 12 mixes, that is, has a compatibility with the thermoplastic resin 21 of the connector resin part 20 in the liquid state.

Both the resins 12 and 21 on the interface between the mold resin 10 and the connector resin part 20 are melted and integrated together, and joined to each other on the interface. For that reason, the adhesion between both the molded products 10 and 20 can be firmly secured through the primary molding technique such as the transfer molding method or the compression molding method suitable for sealing the electronic components without damaging the components.

Third Embodiment

Figure 7A:
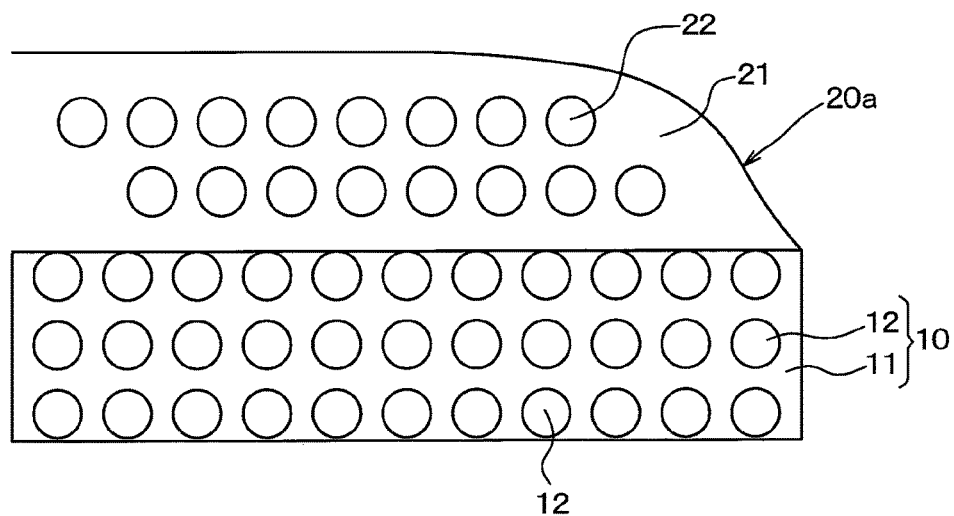
FIG. 7A is a diagram schematically illustrating a state in which a material of a connector resin part is arranged on a mold resin according to a third embodiment of the present disclosure.

A main portion of an electronic device according to a third embodiment of the present disclosure will be described with reference to FIGS. 7A and 7B. The present embodiment is different from the above second embodiment in that the connector resin part 20 that is the second molded product is partially changed, and this difference will be mainly described.

Also, in the present embodiment, as in the second embodiment, the connector resin part 20 mainly contains the thermoplastic resin. However, the present embodiment is different from the above-described second embodiment in that the thermoplastic resin of the connector resin part 20 includes the base resin 21 made of a thermoplastic resin as a base, and a second additive resin 22 made of a thermoplastic resin dispersed in and mixed with the base resin 21.

In this example, the base resin 21 is a thermoplastic resin such as PPS or PBT as in the second embodiment. Also, the second additive resin 22 is made of the same thermoplastic resin as the first additive resin 12, and for example, the above phenoxy resin or thermoplastic epoxy resin.

Figure 7B:
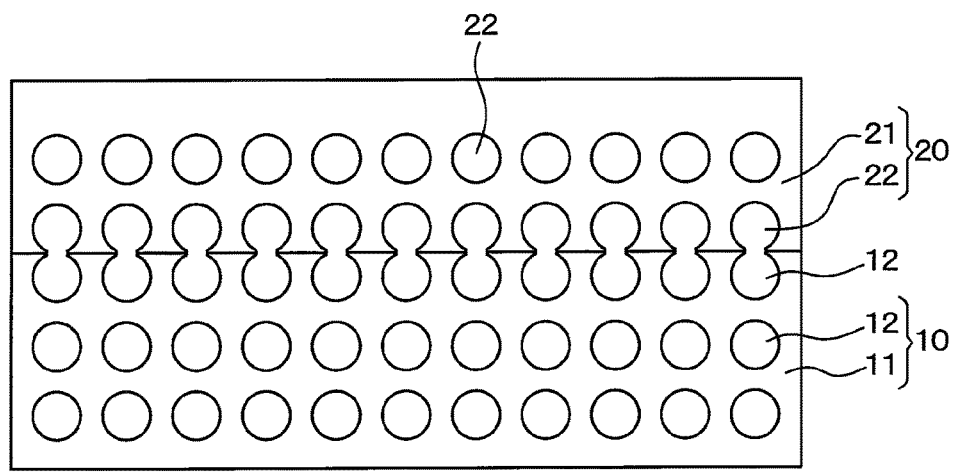
FIG. 7B is a diagram schematically illustrating the vicinity of an interface between the mold resin and the connector resin part in the third embodiment.

As illustrated in FIG. 7B, the first additive resin 12 and the second additive resin 22 which are the same resin are melted and integrated together on the interface between the mold resin 10 that is the first molded product and the connector resin part 20 that is the second molded product.

The pressure sensor according to the present embodiment as described above is manufactured according to the manufacturing method described in the second embodiment. In the present embodiment, in the second preparation step, as the second molding material 20a including the thermoplastic resin which is a raw material of the second molded product, a material including the base resin 21, and the second additive resin 22 dispersed and mixed in the base resin 21 (refer to FIG. 7A) is prepared. The second molding material is prepared by kneading powder, or mixing solution.

Also, in the manufacturing method according to the present embodiment, after the mold resin 10 has been molded through the first molding step as described above, the second molding step is conducted as described above. In the second molding step, as illustrated in FIG. 7A, first, the second molding material 20a is arranged outside of the mold resin 10 and the terminal pins 60 to be covered. In addition, the second molding material 20a is heated, melted, and molded to form the connector resin part 20.

In this state, in the second molding step, the base resin 21 is melted to form the connector resin part 20 having a desired shape, and the first additive resin 12 in the mold resin 10, and the thermoplastic resin 21 of the connector resin part 20 are melted together by the molding heat.

For that reason, as illustrated in FIG. 7B, on the interface between the mold resin 10 and the connector resin part 20, the first additive resin 12, and the second additive resin 22 which are made of the same thermoplastic resin, are integrated together in a liquid state.

In this situation, the first additive resin 12, and the base resin 21 of the connector resin part 20 are also integrated together in the liquid state on the interface. However, because the first additive resin 12 and the second additive resin 22, which are the same resin, are excellent in compatibility, the integration of the first additive resin 12 and the second additive resin 22 is preferentially conducted.

In this way, also, in the present embodiment, through the second molding step, the connector resin part 20 is formed, and the mold resin 10 and the connector resin part 20 are also joined to each other on the interface between those elements 10 and 20. As a result, the pressure sensor according to the present embodiment is completed.

Incidentally, according to the present embodiment, the same advantages as those in the above-described first embodiment are obtained. Further, the second additive resin 22 made of the same thermoplastic resin as the first additive resin 12 is contained in the connector resin part 20 that is the second molded product, to thereby make it easy that both of the additive resins 12 and 22 are melted and integrated together on the interface between both of the molded products 10 and 20.

Fourth Embodiment

In the present embodiment, the present disclosure is applied to the pressure sensor mounted on a vehicle. The pressure sensor detects a pressure (intake pressure) of air sucked into an engine, or a pressure of fuel supplied to the engine.

As illustrated in FIG. 8, a pressure sensor S2 includes a mold IC 410, a connector case 420, and a housing 430.

The mold IC 410 includes a sensor chip 411 as the electronic component, a lead frame 412, and a mold resin 413, and the sensor chip 411 is integrated with the mold resin 413.

The sensor chip 411 has a sensing part made of a diaphragm or the like for detecting a pressure. The sensor chip 411 according to the present embodiment is arranged within an opening 413a formed in the mold resin 413, fixed to the mold resin 413 with an adhesive, and detects a pressure of a pressure medium introduced into the opening 413a.

The lead frame 412 is electrically connected to the sensor chip 411 through a bonding wire or the like, and one end portion of the lead frame 412 is exposed from the mold resin 413.

The mold resin 413 is a primary molded body molded with a thermosetting resin such as epoxy resin. The mold resin 413 also corresponds to the first molded product. The mold resin 413 covers and seals most of the lead frames 412. Also, although not shown, the mold resin 413 incorporates a signal processing circuit IC as the electronic component.

The connector case 420 is a secondary molded body molded integrally with the mold IC 410. The connector case 420 is made of a thermoplastic resin such as PPS (polyphenylene sulfide) or PBT (polybutylene terephthalate). The connector case 420 also corresponds to the second molded product.

In the connector case 420, a connector part 421 connected with an external connector is formed integrally with a covering part 422 that covers terminals 423 and the mold IC 410.

The connector part 421 is a portion that outputs a sensor signal to the external. An interior of the connector part 421 is formed into a hollow cylindrical shape within which one end portions 423a of the terminals 423 are arranged. The other end portions 423b of the terminals 423 are electrically connected with the lead frame 412 of the mold IC 410.

The covering part 422 covers the terminals 423 connected to the lead frames 412 and a portion of the mold IC 410 adjacent to the connector part 421. The covering part 422 exposes a portion of the mold IC 410 adjacent to the sensor chip 411.

The housing 430 is a case made of metal which is coupled with the connector case 420. The housing 430 includes a pressure introduction passage 431 that introduces a pressure medium into a sensing part of the sensor chip 411, and an accommodation part 432 that accommodates a part of the connector case 420. The pressure introduction passage 431 is provided a hollow part of the housing 430. The accommodation part 432 is formed on a portion opposite to the pressure introduction passage 431 as an opening.

The housing 430 is coupled with the connector case 420 by crimping a part 433 of the housing 430 in a state where a portion of the connector case 420 adjacent to the mold IC 410 is accommodated within the accommodation part 432. An O-ring 434 is disposed between the housing 430 and the connector case 420, and a space between the housing 430 and the connector case 420 is sealed with the O-ring 434.

In the pressure sensor S2 configured as described above, in the present embodiment, the mold resin 413 of the mold IC 410 has at least a surface on which a photoresponsive compound is present. The mold IC 410 and the connector case 420 are joined to each other so that the photoresponsive compound present on the surface of the mold resin 413 is mixed with the thermoplastic resin of the connector case 420, and the respective molecules of the photoresponsive compound and the thermoplastic resin are intertwined with each other. In this way, the interface between the mold IC 410 and the connector case 420 is sealed so that a pressure medium does not enter between the mold IC 410 and the connector case 420.

In this example, the photoresponsive compound is a compound that phase transitions from a solid phase or a liquid crystal phase to a liquid phase due to ultraviolet ray irradiation, and phase transitions from the liquid phase to a phase (solid phase or liquid phase) before the ultraviolet ray irradiation due to visible light irradiation or heating.

As the photoresponsive compound of this type, there is a compound having an azobenzene group which is in a liquid crystal phase or a solid phase in a trans-isomer state, and in the liquid phase in a cis-form state. It is generally known that as shown in the following Formula (1), azobenzene isomerizes to the cis-form from the trans-isomer by ultraviolet ray irradiation, and isomerizes to the trans-isomer from the cis-form by visible light irradiation or heating.

[Formula 1]

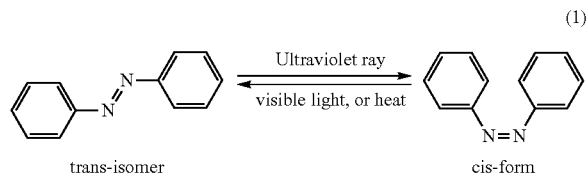

(1)

trans-isomer    cis-form

As specific examples of the photoresponsive compound, for example, there are a liquid crystal compound disclosed in PTL 3 as represented by the following general formula (2), and a compound disclosed in PTL 4 as represented by the following general formula (3) or (4).

[Formula 2]

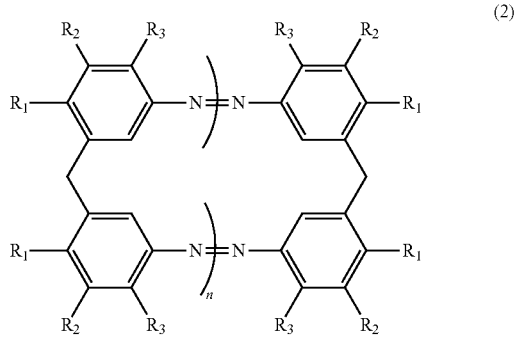

(2)

In general formula (2), $R_1$, $R_2$, and $R_3$ are selected from a group consisting of hydrogen, an alkyl group, an alkoxyl group, an alkoxycarbonyl group, an alkoxycarbonyloxy group, an alkanoyl group, an alkanoyloxy group, an alkoxy phenyl group, and an N-alkylaminocarbonyl group, independently, and n represents an integer. A case in which all of $R_1$, $R_2$, and $R_3$ are hydrogen is excluded.

The compound represent by general formula (2) is a solid phase or a liquid crystal phase in the case of trans-isomer, and a liquid phase in the case of cis-form.

[Formula 3]

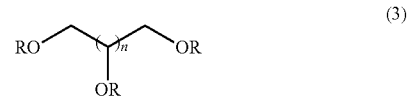

(3)

[Formula 4]

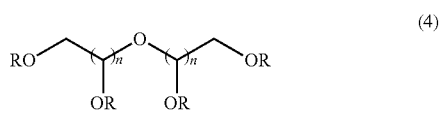

(4)

In the general formulae (3) and (4), R is a group represented by the following general formula (5), and n is an integer of 1 to 4.

[Formula 5]

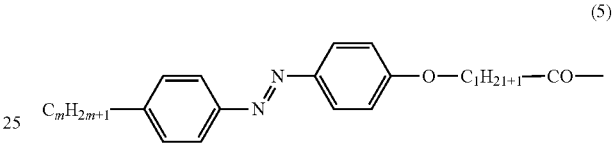

(5)

In the general formula (5), m is an integer of 0 to 16, and l is an integer of 1 to 16.

The compound represent by general formula (3) or (4) is a solid phase in the case of trans-isomer, and a liquid phase in the case of cis-form.

As the photoresponsive compound, a compound having no azobenzene group may be employed if the compound makes a photoisomerization reaction, and is a solid phase or a liquid crystal phase in the case of trans-isomer, and a liquid phase in the case of cis-form.

Subsequently, a method for manufacturing the pressure sensor according to the present embodiment will be described.

First, as illustrated in (a) of FIG. 9, a first molded product molding step of molding the mold resin 413 of the mold IC 410 is conducted. Specifically, in a state where the lead frames 412 are installed within a molding mold die, a thermoplastic resin heated and melted is injected into the mold die through a transfer method, a compression method, or an injection method to mold the mold resin 413. In this situation, in the present embodiment, a thermosetting resin mixed with the photoresponsive compound is used.

With the above molding, as illustrated in (a) of FIG. 10, a thermosetting resin 531 and a photoresponsive compound 440 are allowed to be present on a surface 413b of the molded mold resin 413. The photoresponsive compound 440 that has been resin-cured has a trans structure, and is a solid phase or a liquid crystal phase. The photoresponsive compound 440 is fixed to a surface of the mold resin 413 because photoresponsive compound molecules are intertwined with thermoplastic resin molecules, that is, the photoresponsive compound 440 is retained to a cross-linked structure of the thermosetting resin that has reacted with a curing agent through an intermolecular force. Also, because a retention force thereof is higher than a force applied at the time of thermoplastic resin molding, the photoresponsive compound is retained on the interface.

After the mold resin 413 has been molded, as illustrated in FIG. 8, the sensor chip 411 is fitted to the opening 413a disposed in the mold resin 413.

Subsequently, a connection step of connecting the lead frames 412 of the mold IC 410 to the terminals 423 is conducted.

Subsequently, an ultraviolet ray irradiation step of irradiating the surface 413b of the mold resin 413 with ultraviolet ray is conducted as illustrated in (b) of FIG. 9. As a result, as illustrated in (b) of FIG. 10, the photoresponsive compound 440 that is present in the vicinity of the surface of the mold resin 413 forms a cis structure, and becomes a liquid phase. That is, the thermosetting resin 531, and the photoresponsive compound 440 of the liquid phase are present on the surface 413b of the mold resin 413, and the surface 413b of the mold resin 413 is partially liquefied.

In the present embodiment, the first molded product molding step to the ultraviolet ray irradiation step described above correspond to the first molded product preparation step. The ultraviolet ray irradiation step illustrated in (b) of FIG. 9 may be conducted before the connection step of the lead frames 412 and the terminals 423.

Subsequently, the second molded product molding step of molding the connector case 420 with the thermoplastic resin so as to come in contact with the surface 413b of the mold resin 413 irradiated with the ultraviolet ray is conducted as illustrated in (c) of FIG. 9.

Specifically, in a state where the mold IC 410 connected with the terminals 423 is installed within the molding mold die, the thermoplastic resin heated and melted is injected into the mold die by the injection method or the extrusion method. In this situation, the liquid thermoplastic resin comes in contact with the surface 413b of the mold resin 413, the liquid photoresponsive compound 440 and a thermoplastic resin 601 which is liquid likewise are mixed together as illustrated in an area surrounded by a dashed line in (c) of FIG. 10, and the respective molecules are intertwined with each other, and coupled with each other. Thereafter, the liquid thermoplastic resin is solidified to prepare the connector case 420.

Subsequently, as illustrated in (d) of FIG. 9, a phase transition step of subjecting the surface 413b of the mold resin 413 that comes in contact with the connector case 420 to visible light irradiation or heating is conducted. As a result, as indicated by a region surrounded by a dashed line in (d) of FIG. 10, the photoresponsive compound 440 changes from the cis structure to the trans structure, and phase transitions from the liquid phase to the solid phase or the liquid crystal phase. As a result, a joint of the interface between the mold resin 413 of the mold IC 410 and the connector case 420 is formed.

In this situation, even if the photoresponsive compound 440 and the thermoplastic resin 601 are mixed together to couple the respective molecules together, the connector case 420 and the mold resin 413 are separated from each other if the photoresponsive compound 440 remains in the liquid phase. On the contrary, the photoresponsive compound 440 phase transitions to the solid phase, the connector case 420 is fixed to the mold resin 413. Also, the photoresponsive compound 440 phase transitions to the liquid crystal phase whereby the liquid crystal phase is higher in viscosity than the liquid phase. As a result, the relative movement of the connector case 420 is suppressed to make difficult to separate the connector case 420 from the mold resin 413. In this way, the joint on the interface is formed.

Also, when the visible light irradiation is conducted in the phase transition step, if a transparent resin that transmits the visible light is used as the thermoplastic resin forming the connector case 420, an outer surface of the connector case 420 is irradiated with the visible light. As a result, because the overall surface 413b of the mold resin 413 is irradiated with the visible light, a joint is formed in an overall area of the interface between the mold resin 413 of the mold IC 410 and the connector case 420. On the other hand, when a resin that does not transmit the visible light is used as the thermoplastic resin forming the connector case 420, the exposed interface between the mold resin 413 and the connector case 420 is irradiated with the visible light. As a result, the joint of the interface between the mold resin 413 and the connector case 420 is formed in the vicinity of at least the exposed interface. Since the exposed interface between the mold resin 413 and the connector case 420 is exposed to a pressure medium, the pressure medium can be prevented from entering between the mold IC 410 and the connector case 420 by sealing the exposed interface.

Subsequently, as illustrated in FIG. 8, the connector case 420 is fitted into the housing 430 through the O-ring 434, and a part 433 of the housing 430 is crimped toward the connector case 420, to thereby integrate the connector case 420 and the housing 430 together. With the above process, the pressure sensor S2 illustrated in FIG. 8 is completed.

As described above, in the present embodiment, in the second molded product molding step, as illustrated in (c) of FIG. 10, after the liquid-phase photoresponsive compound 440 and the liquid thermoplastic resin 601 are mixed together, the thermoplastic resin 601 is solidified. Thereafter, in the phase transition step, as illustrated in (d) of FIG. 10, the photoresponsive compound 440 phase transitions to the solid phase or the liquid crystal phase lower in liquidity than the liquid phase to join the mold resin 413 of the mold IC 410 to the connector case 420. Under a usage environment of the pressure sensor S2, since the interface between the mold resin 413 and the connector case 420 is not irradiated with the ultraviolet ray, the joint state of the interface is maintained.

For that reason, according to the present embodiment, sealing of the interface between the mold resin 413 made of the thermosetting resin and the connector case 420 made of the thermoplastic resin can be achieved even if the sealing material is not applied after the formation of the connector case 420.

Also, in the present embodiment, instead of the step of applying the sealing material when the sealing material of a potting material is applied as described above, the ultraviolet ray irradiation step illustrated in (b) of FIG. 9, and the phase transition step illustrated in (d) of FIG. 9 are conducted.

In the general molding of the thermosetting resin, because a release agent is added to the thermosetting resin, an adhesive force of the thermosetting resin is reduced. For that reason, in order to adhere the first molded product made of the thermosetting resin to the second molded product made of the thermoplastic resin, a surface treatment in which the surface of the first molded product is irradiated with the ultraviolet ray to improve the adhesive force is conducted. Since the ultraviolet ray irradiation step according to the present embodiment is conducted instead of the ultraviolet ray irradiation of the surface treatment, the above-mentioned joint of the interface is enabled while suppressing an increase in the number of manufacturing processes according to the present embodiment.

Fifth Embodiment

In the manufacturing method of the pressure sensor according to the fourth embodiment, as illustrated in (a) and (b) of FIG. 9, the mold resin 413 is irradiated with the ultraviolet ray after formation of the mold resin 413. However, in the present embodiment, the mold resin 413 is irradiated with the ultraviolet ray at the time of molding the mold resin 413.

That is, as illustrated in FIG. 11, in a runner 451 forming a flow path of resin injected into a molding mold die 450, the resin passing through an interior of the runner 451 can be irradiated with the ultraviolet ray. When the mold resin 413 is molded with the thermosetting resin mixed with the photoresponsive compound, a thermosetting resin 531 that passes through the runner 451 is irradiated with the ultraviolet ray.

In this way, in the present embodiment, the thermosetting resin 531 before being injected into the mold die 450, that is, the thermosetting resin 531 that flows toward the interior of the mold die 450 is irradiated with the ultraviolet ray. As a result, the photoresponsive compound 440 forms the trans structure, and is the solid phase or the liquid crystal phase before passing through the runner 451, but forms the cis structure, and becomes the liquid phase after passing through the runner 451.

As a result, as illustrated in (b) of FIG. 10, the thermosetting resin 531 and the photoresponsive compound 440 of the liquid phase are present on the surface 413*b* of the mold resin 413 that has been molded, as well as after the ultraviolet ray irradiation step of the fourth embodiment, and the surface 413*b* of the mold resin 413 is partially liquefied. In the present embodiment, the first molded product molding step corresponds to the first molded product preparation step.

Thereafter, as in the fourth embodiment, the second molded product molding step and the subsequent steps are conducted. In this way, even if a part of the fourth embodiment is changed, the same effects as those in the fourth embodiment are obtained.

Sixth Embodiment

In the present embodiment, the first molded product molding step illustrated in (a) of FIG. 9 is changed in the manufacturing method of the pressure sensor according to the fourth embodiment.

In the present embodiment, the mold resin 413 of the mold IC 410 is molded as follows. First, as illustrated in (a) of FIG. 12, a film 460 made of a photoresponsive compound as the photoresponsive compound layer is prepared, and the film 460 is fixedly attached to an inner surface of the molding mold die 450. The fixation of the film 460 can be conducted by vacuuming or the like. In this situation, the film 460 is arranged on inner surfaces of an upper die and a lower die of the mold die 450 so that the film 460 adheres to the surface 413*b* of the mold resin 413 which is joined to the connector case 420.

Subsequently, as illustrated in (b) of FIG. 12, the thermosetting resin 531 is injected into the mold die 450 to mold the mold resin 413 in a state where the film 460 is fixed to the inner surface of the mold die 450. As a result, the mold resin 413 whose surface 413*b* adheres to the film 460 is prepared. Since the thermosetting resin has an adhesive force higher than the thermoplastic resin, the film 460 adheres to the surface of the mold resin 413 by the adhesive force of the thermosetting resin.

With this molding, the photoresponsive compound 440 is present on the surface 413*b* of the molded mold resin 413.

Thereafter, an ultraviolet ray irradiation step of irradiating the surface 413*b* of the mold resin 413, that is, the film 460 with ultraviolet ray is conducted as illustrated in (a) of FIG. 13. This step is identical with the step illustrated in (b) of FIG. 9 described in the fourth embodiment. As a result, like the photoresponsive compound 440 in (b) of FIG. 10, the photoresponsive compound that is present on the surface 413*b* of the mold resin 413 forms a cis structure, and becomes a liquid phase. In the present embodiment, the first molded product molding step to the ultraviolet ray irradiation step described above correspond to the first molded product preparation step.

Subsequently, the second molded product molding step of molding the connector case 420 with the thermoplastic resin so as to come in contact with the surface 413*b* of the mold resin 413 irradiated with the ultraviolet ray, that is, the film 460, is conducted as illustrated in (b) of FIG. 13. This step is identical with the step illustrated in (c) of FIG. 9 described in the fourth embodiment. With the above process, as with the region surrounded by the dashed line in (c) of FIG. 10, the liquid photoresponsive compound and the thermoplastic resin which is likewise liquid are mixed together, and the respective molecules are intertwined with each other, and coupled with each other.

Subsequently, as illustrated in (c) of FIG. 13, a phase transition step of subjecting the surface 413*b* of the mold resin 413 that comes in contact with the connector case 420, that is, the film 460 to visible light irradiation or heating is conducted. This step is identical with the step illustrated in (d) of FIG. 9 described in the fourth embodiment. As a result, as with the region surrounded by the dashed line in (d) of FIG. 10, the photoresponsive compound of the film 460 changes from the cis structure to the trans structure, and phase transitions from the liquid phase to the solid phase or the liquid crystal phase. As a result, a joint of the interface between the mold resin 413 of the mold IC 410 and the connector case 420 is formed.

In this way, also according to the present embodiment, sealing of the interface between the mold resin 413 and the connector case 420 can be achieved even if the sealing material is not applied after the formation of the connector case 420, as in the fourth embodiment.

Seventh Embodiment

In the present embodiment, a step of irradiating the film 460 with the ultraviolet ray is added during the first molded product molding step of the sixth embodiment for the purpose of enhancing the adhesive force between the film 460 and the mold resin 413.

As illustrated in (a) of FIG. 14, the film 460 made of a photoresponsive compound is fixed to an inner surface of the mold die 450. This step is identical with the step illustrated in (a) of FIG. 12.

Thereafter, as illustrated in (b) of FIG. 14, a surface 460*a* of the film 460 fixed to the inner surface of the mold die 450 is irradiated with the ultraviolet ray. The surface 460*a* of the film 460 is a surface opposite to a surface that comes in contact with the mold die 450, which is a surface on a side that comes in contact with the mold resin 413. As a result, in a portion of the film 460 adjacent to the surface 460*a*, the photoresponsive compound forms the cis structure, and becomes a liquid phase.

Subsequently, as illustrated in (c) of FIG. 14, the thermosetting resin 531 is injected into the mold die 450 to mold the mold resin 413. In this situation, the liquid photoresponsive compound on the surface 460*a* side of the film 460 and the thermosetting resin 531 which is liquid likewise are mixed together, and the respective molecules are intertwined with each other, and coupled with each other. Further, the thermosetting resin 531 is cured to adhere the film 460 to the mold resin 413. With the above adhesion, the adhesive force between the film 460 and the mold resin 413 can be enhanced.

Thereafter, the steps illustrated in (a) to (c) of FIG. 13 are conducted in the same manner as in the sixth embodiment.

In the sixth and seventh embodiments, the film 460 made of the photoresponsive compound is fixedly attached to the inner surface of the mold die 450. Alternatively, the photoresponsive compound layer may be fixed to the inner surface of the mold die 450 through another method. For example, after the solution in which the photoresponsive compound is mixed with the solution is allowed to flow onto, or be applied on or sprayed on the inner surface of the mold die 450, the solvent is removed. As a result, the photoresponsive compound layer can be formed on the inner surface of the mold die 450.

Eighth Embodiment

In the fourth to seventh embodiments, the phase transition step of allowing the photoresponsive compound to phase transition by the visible light irradiation or heating illustrated in (d) of FIG. 9 is conducted after the second molded product molding step. Alternatively, the phase transition step may be conducted in the second molded product molding step. That is, in the second molded product molding step, when an annealing process of removing the distortion by injecting the liquid thermoplastic resin into the interior of the mold die, solidifying at least a surface of the connector case 420, and thereafter heating the connector case 420 to gradually cool the connector case 420 is conducted, the phase transition step may be conducted by heating in the annealing process.

When the photoresponsive compound phase transitions from the liquid phase at a heating temperature during the annealing process, the annealing process is merely conducted as described above, thereby enabling the photoresponsive compound to transition from the liquid phase to the solid phase or the liquid crystal phase.

Even when the sealing material such as the potting material is applied, the annealing process is conducted in the molding of the second molded product. For that reason, according to the present embodiment, the phase transition step is conducted by heating in the annealing process, as a result of which, as compared with a case in which the sealing material is applied, the above joint on the interface is enabled while suppressing an increase in the number of manufacturing processes.

Figure 1:
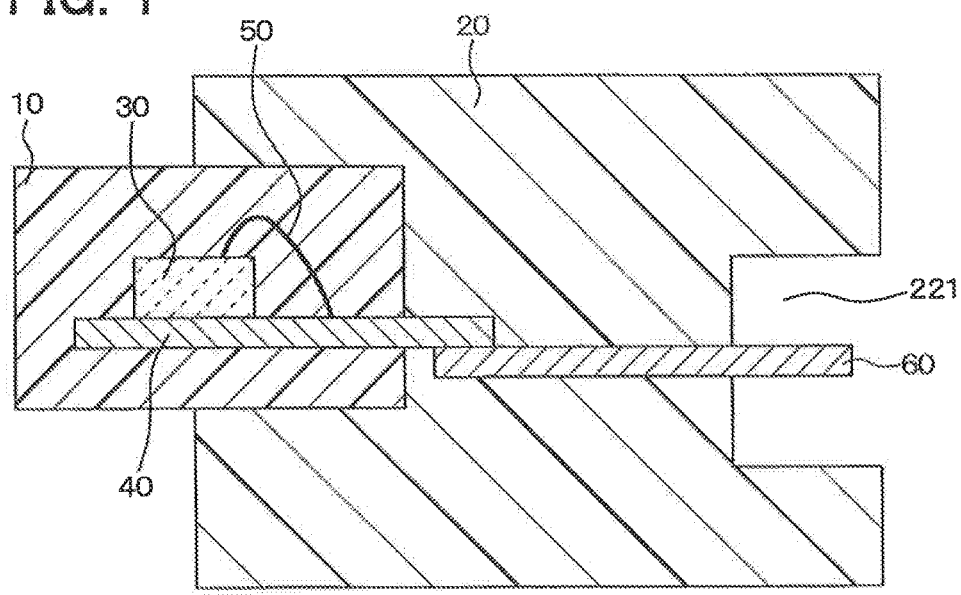
FIG. 1 is a diagram illustrating a schematic cross-sectional configuration of an electronic device according to a first embodiment of the present disclosure.

Other Embodiments (1) The configuration or the manufacturing method in the second embodiment or the third embodiment may be applied to the first molded product 10 and the second molded product 20 in the electronic device illustrated in FIG. 1. Also, the configuration or the manufacturing method in the first embodiment may be applied to the mold resin 10 as the first molded product and the connector resin part 20 as the second molded product in the pressure sensor S1 as the electronic device illustrated in FIG. 4.

(2) In the above-mentioned respective embodiments, the sensor chip 411 adheres to the inner portion of the opening 413a of the mold resin 413. Alternatively, the sensor chip 411 may adhere to an outer surface of the mold resin 413. Also, a portion on the other end side of the sensor chip is coated with a mold resin while the sensing portion disposed on one end side of the sensor chip is exposed, whereby the sensor chip 411 may be integrated with the mold resin 413.

(3) In the above-mentioned first to third embodiments, the first molded product 10, the second molded product 20, and the manufacturing method thereof are applied to the structure in which the electronic component is sealed with the first molded product 10, but can be applied to not only the structure in which the electronic component is sealed with the first molded product 10, but also a structure in which the electronic component is integrated with the first molded product 10. For example, the first molded product 10, the second molded product 20, and the manufacturing method are also applied to a structure in which the electronic component after being molded is integrated with the first molded product 10 as in the pressure sensor of the fourth embodiment.

(4) In the above-mentioned respective embodiments, the present disclosure is applied to the pressure sensor. Alternatively, the present disclosure can be applied to other sensors such as a magnetic sensor, a humidity sensor, or an acceleration sensor, or electronic devices other than the sensors. As the electronic device applied with the present disclosure, there are electronic devices in which a part or an entirety of an electronic component is covered with a resin molded body, and electronic devices in which the electronic component is fixed to the resin molded body without being coated with the resin molded body. In particular, as in the above respective embodiments, the present disclosure is effectively applied to the electronic device integrated with the electronic component, and having the resin molded body having the connector part.

Further, the present disclosure is not limited to the above embodiments, but can appropriately change within a scope of the claims. Also, the above embodiments are not limited to the above illustrative examples. Further, in the embodiments described above, it goes without saying that the components forming the embodiments are not always indispensable unless otherwise stated or except the case where the components are apparently indispensable in principle. Also, in the above embodiments, when reference is made to a number including the number of pieces, numerical values, quantity, range, or the like in the components of the embodiments, the number thereof is not limited to a specific number unless otherwise stated and except the case where the number is definitely limited to the specific number in principle.

The invention claimed is:

1. An electronic device, comprising:
a first molded product integrated with an electronic component; and
a second molded product secondarily molded outside of the first molded product, wherein
the first molded product includes a thermosetting resin, and a first additive contained in the thermosetting resin,
the thermosetting resin of the first molded product includes a ratio of a base material and a curing agent that is shifted from an equivalent ratio, and a surplus material of the base material and the curing agent that shifts the ratio from the equivalent ratio is the first additive,
the second molded product includes a thermoplastic resin, and a second additive contained in the thermoplastic resin and having a reactive group or a skeleton that can joining-react with the first additive, and
an interface between the first molded product and the second molded product attaches the first molded product to the second molded product at the first additive and the second additive located at the interface, the first additive and the second additive are attached to each other by one or more joint actions selected from covalent bonding, ionic bonding, hydrogen bonding, intermolecular forces, dispersion force, and diffusion.

2. The electronic device according to claim 1, wherein the second additive has a reactive group or a skeleton that can joining-react with the first additive as the surplus material.

3. The electronic device according to claim 1, wherein the first molded product is disposed to seal the electronic component.

4. A method for manufacturing an electronic device that includes:
a first molded product integrated with an electronic component; and
a second molded product secondarily molded outside of the first molded product,
the method comprising:
preparing a first molding material including a thermosetting resin, and a first additive contained in the thermosetting resin as a raw material of the first molded product, the thermosetting resin of the first molded product includes a ratio of a base material and a curing agent that is shifted from an equivalent ratio, and a surplus material of the base material and the curing agent that shifts the ratio from the equivalent ratio is the first additive;
preparing a second molding material including a thermoplastic resin, and a second additive contained in the thermoplastic resin and having a reactive group or a skeleton that can joining-react with the first additive as a raw material of the second molded product;
thermally curing the first molding material to form the first molded product; and
arranging the second molding material outside of the first molded product, and joining the first additive and the second additive on an interface between the first molded product and the second molded product to attach the first molded product to the second molded product at the first additive and the second additive located at the interface by one or more joint actions selected from covalent bonding, ionic bonding, hydrogen bonding, intermolecular forces, dispersion force, and diffusion due to a molding heat of the second molded product, to form the second molded product.

5. The method for manufacturing the electronic device according to claim 4, wherein in the thermally curing, the first molding material is thermally cured so as to seal the electronic component to form the first molded product.

6. An electronic device, comprising:
a first molded product integrated with an electronic component; and
a second molded product including a thermoplastic resin which is secondarily molded outside of the first molded product, wherein
the first molded product includes a thermosetting resin, and a first additive resin dispersed in the thermosetting resin and made of a thermoplastic resin,
the first additive resin has a glass transition temperature or a softening point lower than a molding temperature of the second molded product, and a pyrolysis temperature higher than the molding temperature of the second molded product,
the first additive resin has compatibility with a thermoplastic resin of the second molded product, and an interface between the first molded product and the second molded product is attached together via the first additive resin of the first molded product being integrated with the thermoplastic resin of the second molded product.

7. The electronic device according to claim 6, wherein the second molded product includes a base resin made of a thermoplastic resin which is a base, and a second additive resin dispersed in the base resin and made of the same thermoplastic resin as that of the first additive resin, and
wherein the first additive resin and the second additive resin are melted and integrated together on the interface between the first molded product and the second molded product.

8. The electronic device according to claim 6, wherein the first molded product is disposed to seal the electronic component.

9. A method for manufacturing an electronic device that includes:
a first molded product integrated with an electronic component; and
a second molded product including a thermoplastic resin which is secondarily molded outside of the first molded product,
the method comprising:
preparing a first molding material including a thermosetting resin, and a first additive resin dispersed in the thermosetting resin and made of a thermoplastic resin as a raw material of the first molded product, in which the first additive resin has a glass transition temperature or a softening point lower than a molding temperature of the second molded product, and a pyrolysis temperature higher than the molding temperature of the second molded product, the first additive resin has compatibility with a thermoplastic resin of the second molded product;
preparing a second molding material including a thermoplastic resin as a raw material of the second molded product;
thermally curing the first molding material to form the first molded product; and
arranging the second molding material outside of the first molding material, and integrally melting the first additive resin and the thermoplastic resin forming the second molded product on an interface between the first molded product and the second molded product due to a molding heat of the second molded product, to form the second molded product.

10. The method for manufacturing the electronic device according to claim 9, wherein in the thermally curing, the first molding material is thermally cured so as to seal the electronic component to form the first molded product.

11. A method for manufacturing an electronic device including
a first molded product that is integrated with an electronic component, that is molded with a thermosetting resin, and that includes a photoresponsive compound on a surface of the first molded product, and
a second molded product joined to at least a part of the first molded product, and molded with a thermoplastic resin,
the method comprising:
preparing the first molded product on the surface of which a photoresponsive compound that phase transitions from a solid phase or a liquid crystal phase to a liquid phase due to ultraviolet ray irradiation, and phase transitions from the liquid phase to a phase before the ultraviolet ray irradiation due to visible light irradiation or heating is present, in which the photoresponsive compound is phase transitioned to the liquid phase by the ultraviolet ray irradiation; molding the second molded product by injecting a liquid thermoplastic resin into a mold die, and bringing the liquid thermoplastic resin into contact with a surface of the first molded product in a state where the first molded product is disposed within the mold die, and solidifying the liquid thermoplastic resin; and allowing the photoresponsive compound to phase transition from the liquid phase to the solid phase or the liquid crystal phase by subjecting the surface of the first molded product which comes in contact with the second molded product to visible light irradiation or heating after injecting the liquid thermoplastic resin into the mold die.

12. The method for manufacturing the electronic device according to claim 11,
    wherein the preparing of the first molded product includes:
    molding the first molded product with the thermosetting resin mixed with the photoresponsive compound; and
    irradiating a surface of the molded first molded product with ultraviolet ray.

13. The method for manufacturing the electronic device according to claim 11, wherein the preparing of the first molded product includes injecting the thermosetting resin mixed with the photoresponsive compound into a mold die to mold the first molded product, and irradiating the thermosetting resin before being injected into the mold die with the ultraviolet ray.

14. The method for manufacturing the electronic device according to claim 11,
    wherein the preparing of the first molded product includes:
    injecting the thermosetting resin into the mold die in a state where a photoresponsive compound layer is fixed to an inner surface of the mold die to mold the first molded product having a surface to which the photoresponsive compound layer adheres; and
    irradiating the surface of the formed first molded product with ultraviolet ray.

15. The method for manufacturing the electronic device according to claim 11,
    wherein the molding of the second molded product conducts an annealing process of heating the second molded product, and gradually cooling the second molded product to remove distortion after injecting the liquid thermoplastic resin into the mold die, and solidifying at least a surface of the second molded product, and
    wherein the allowing of the photoresponsive compound to the phase transition is conducted by the heating in the annealing process.

16. The method for manufacturing the electronic device according to claim 11, wherein a compound that conducts light isomerization reaction is used as the photoresponsive compound.

17. The method for manufacturing the electronic device according to claim 16, wherein a compound having an azobenzene group is used as the photoresponsive compound.

18. An electronic device, comprising:
    a first molded product integrated with an electronic component, and includes a thermosetting resin; and
    a second molded product joined to at least a part of the first molded product, and molded with a thermoplastic resin, wherein
    the first molded product further includes a photoresponsive compound on a surface of the first molded product,
    the photoresponsive compound has a property of absorbing ultraviolet ray to phase transition from a solid phase or a liquid crystal phase to a liquid phase,
    the photoresponsive compound has a property of absorbing visible light or heat to phase transition from the liquid phase to a phase before absorbing the ultraviolet ray, and
    the first molded product and the second molded product are attached to each other via the photoresponsive compound present on the surface of the first molded product being mixed with the thermoplastic resin, and molecules of the photoresponsive compound and the thermoplastic resin are intertwined with each other to attach the first molded product and the second molded product.

19. The electronic device according to claim 18, wherein the photoresponsive compound has a property of conducting a light isomerization reaction.

20. The electronic device according to claim 18, wherein the photoresponsive compound has an azobenzene group.

* * * * *